(12) United States Patent
Ishihara et al.

(10) Patent No.: US 10,256,175 B2
(45) Date of Patent: Apr. 9, 2019

(54) PRINTED WIRING BOARD AND METHOD FOR MANUFACTURING PRINTED WIRING BOARD

(71) Applicant: IBIDEN CO., LTD., Ogaki (JP)

(72) Inventors: Teruyuki Ishihara, Ogaki (JP); Hiroyuki Ban, Ogaki (JP); Haiying Mei, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/681,695

(22) Filed: Aug. 21, 2017

(65) Prior Publication Data

US 2018/0053715 A1    Feb. 22, 2018

(30) Foreign Application Priority Data

Aug. 22, 2016    (JP) .................................. 2016-161866

(51) Int. Cl.
*H01L 23/498*    (2006.01)
*H01L 21/48*    (2006.01)
(Continued)

(52) U.S. Cl.
CPC ...... *H01L 23/49822* (2013.01); *H01L 21/486* (2013.01); *H01L 21/4853* (2013.01); *H01L 21/4857* (2013.01); *H01L 21/6835* (2013.01); *H01L 21/76885* (2013.01); *H01L 23/31* (2013.01); *H01L 23/49811* (2013.01); *H01L 23/49827* (2013.01); *H01L 23/49838* (2013.01); *H01L 23/49894* (2013.01); *H01L 24/13* (2013.01); *H01L 24/16* (2013.01); *H01L 24/81* (2013.01); *H01L 2221/68345* (2013.01); *H01L 2221/68359* (2013.01); *H01L 2224/131* (2013.01); *H01L 2224/16227* (2013.01); *H01L 2224/81005* (2013.01); *H01L 2224/81191* (2013.01); *H01L 2224/81192* (2013.01); *H01L 2224/81815* (2013.01); *H01L 2924/14* (2013.01); *H01L 2924/1533* (2013.01);
(Continued)

(58) Field of Classification Search
CPC ................................................. H01L 23/49822
See application file for complete search history.

(56) References Cited

U.S. PATENT DOCUMENTS

2012/0234589 A1\*    9/2012    Furuichi ............. H05K 3/4682
174/261
2014/0144676 A1\*    5/2014    Chung .................. H05K 1/186
174/251

FOREIGN PATENT DOCUMENTS

JP    2009-224739 A    10/2009

\* cited by examiner

*Primary Examiner* — Mounir S Amer
(74) *Attorney, Agent, or Firm* — Oblon, McClelland, Maier & Neustadt, L.L.P.

(57) ABSTRACT

A printed wiring board includes a support plate, a laminate formed on the support plate and including first conductor pads on a first surface side of the laminate and second conductor pads on a second surface side of the laminate, and a solder resist layer interposed between the support plate and the laminate and having openings formed such that the openings are exposing the first conductor pads respectively. The laminate includes a resin insulating layer and has a first surface on the first surface side and a second surface on the second surface side on the opposite side with respect to the first surface of the laminate, the second conductor pads are embedded in the second surface of the laminate such that the second conductor pads have surfaces recessed from the second surface of the laminate respectively.

20 Claims, 17 Drawing Sheets

(51) Int. Cl.
  *H01L 21/683* (2006.01)
  *H01L 23/00* (2006.01)
  *H01L 21/768* (2006.01)
  *H01L 23/31* (2006.01)
(52) U.S. Cl.
  CPC ............... *H01L 2924/15192* (2013.01); *H01L 2924/15313* (2013.01); *H01L 2924/3511* (2013.01)

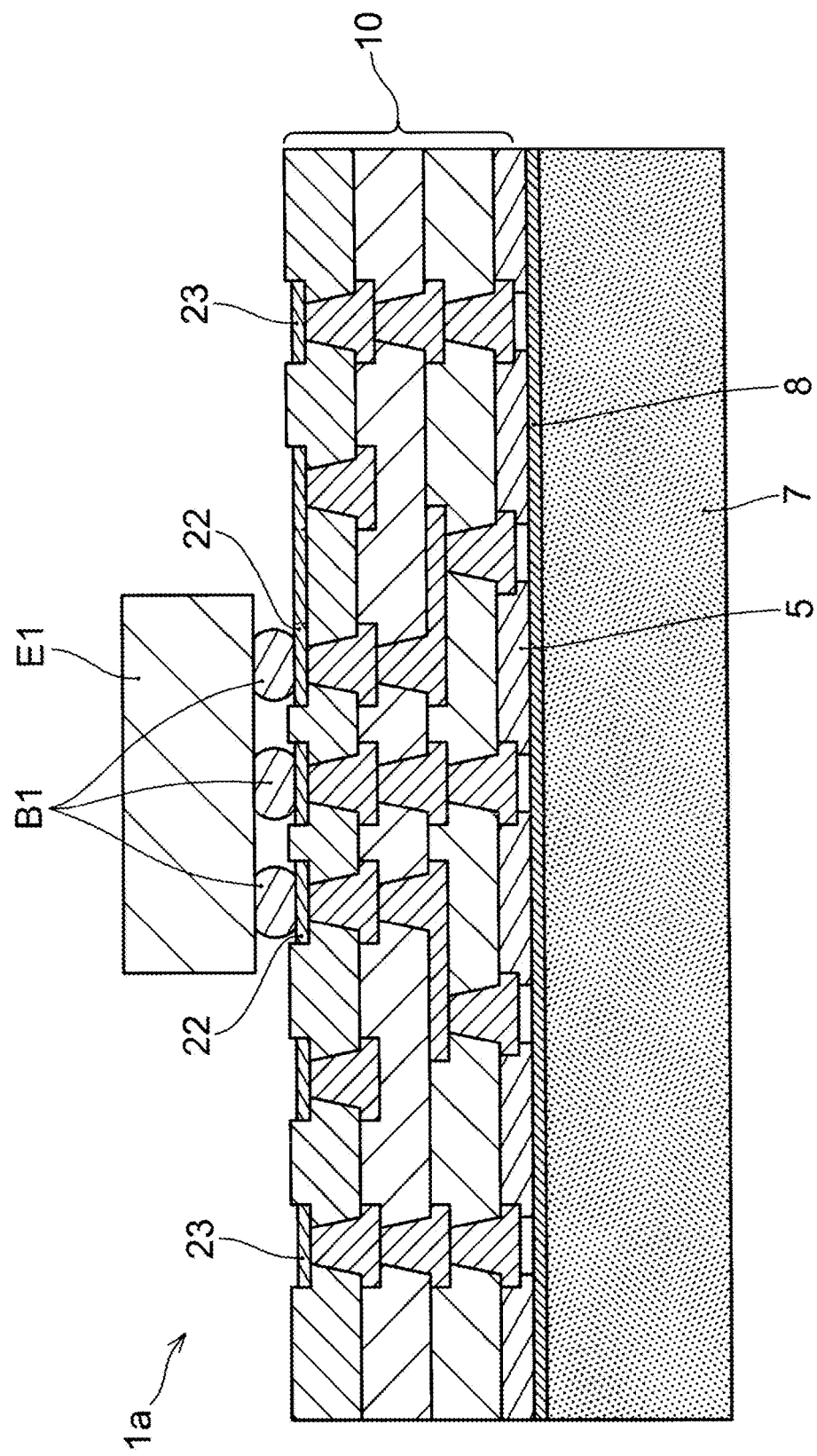

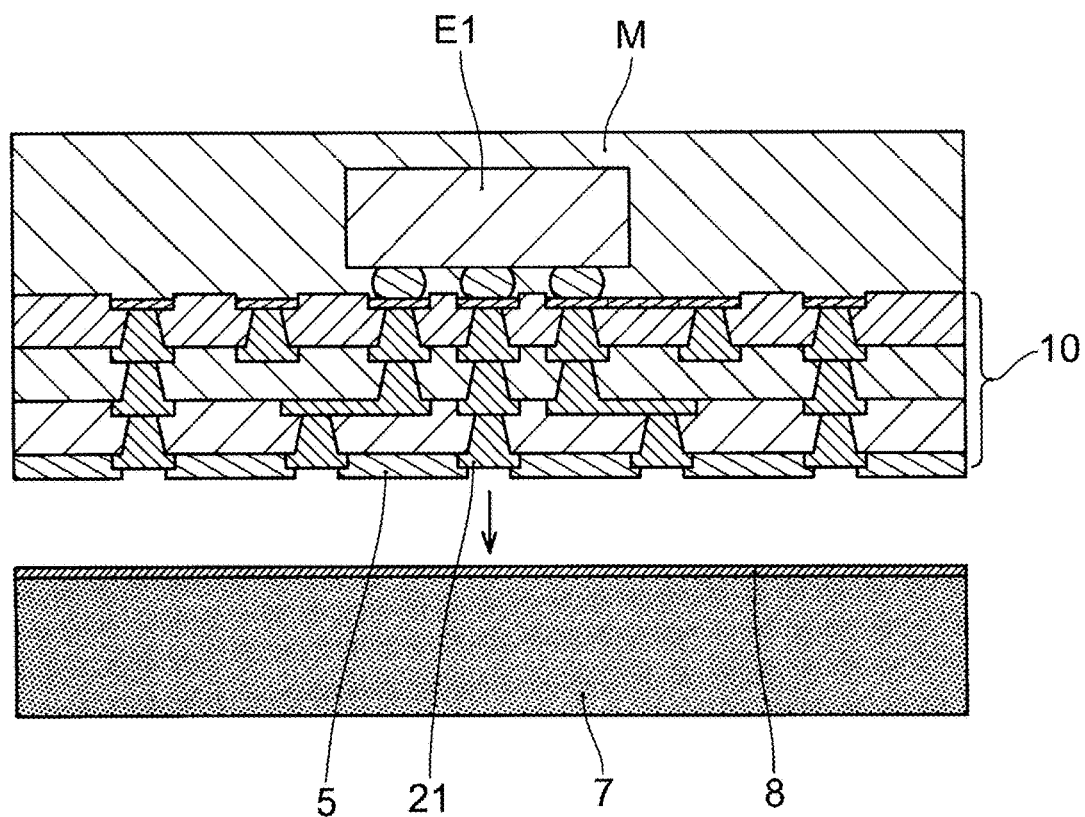

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2016-161866, filed Aug. 22, 2016, the entire contents of which are incorporated herein by reference.

BACKGROUND OF THE INVENTION

Field of the Invention

The present invention relates to a printed wiring board having a support plate and relates to a method for manufacturing the printed wiring board.

Description of Background Art

Japanese Patent Laid-Open Publication No. 2009-224739 describes a multilayer wiring board that does not have a core substrate. The multilayer wiring board is formed from only wiring patterns such as connection pads and an insulating layer and a protective film. The connection pads of the multilayer wiring board that are formed on a mounting surface for a semiconductor element are formed on the insulating layer. The entire contents of this publication are incorporated herein by reference.

SUMMARY OF THE INVENTION

According to one aspect of the present invention, a printed wiring board includes a support plate, a laminate formed on the support plate and including first conductor pads on a first surface side of the laminate and second conductor pads on a second surface side of the laminate, and a solder resist layer interposed between the support plate and the laminate and having openings formed such that the openings are exposing the first conductor pads respectively. The laminate includes a resin insulating layer and has a first surface on the first surface side and a second surface on the second surface side on the opposite side with respect to the first surface of the laminate, the second conductor pads are embedded in the second surface of the laminate such that the second conductor pads have surfaces recessed from the second surface of the laminate respectively.

According to another aspect of the present invention, a method for manufacturing a printed wiring board includes forming a conductor layer on a metal foil provided on a base plate, laminating, on the conductor layer, at least one set of a resin insulating layer and a conductor layer, such that a laminate including the conductor layers and resin insulating layer is formed to have a first surface and a second surface on a metal foil side on the opposite side with respect to the first surface, forming a solder resist layer on the first surface of the laminate, positioning a support plate on the first surface of the laminate such that the solder resist layer is interposed between the laminate and the support plate, removing the base plate from the laminate, and etching the metal foil on the laminate such that the metal foil is removed from the laminate. The forming of the conductor layer on the metal foil includes forming second conductor pads on the metal foil, the forming of the laminate includes forming first conductor pads on a first surface side of the laminate, and the removing of the metal foil includes exposing surfaces of the second conductor pads and forming the surfaces of the second conductor pads recessed from the second surface of the laminate respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 illustrates a printed wiring board according to an embodiment of the present invention, in which an electronic component is mounted;

FIG. 5M illustrates an example of removal of the support plate in the method for manufacturing the printed wiring board of the embodiment;

DETAILED DESCRIPTION OF THE EMBODIMENTS

Figure 1:
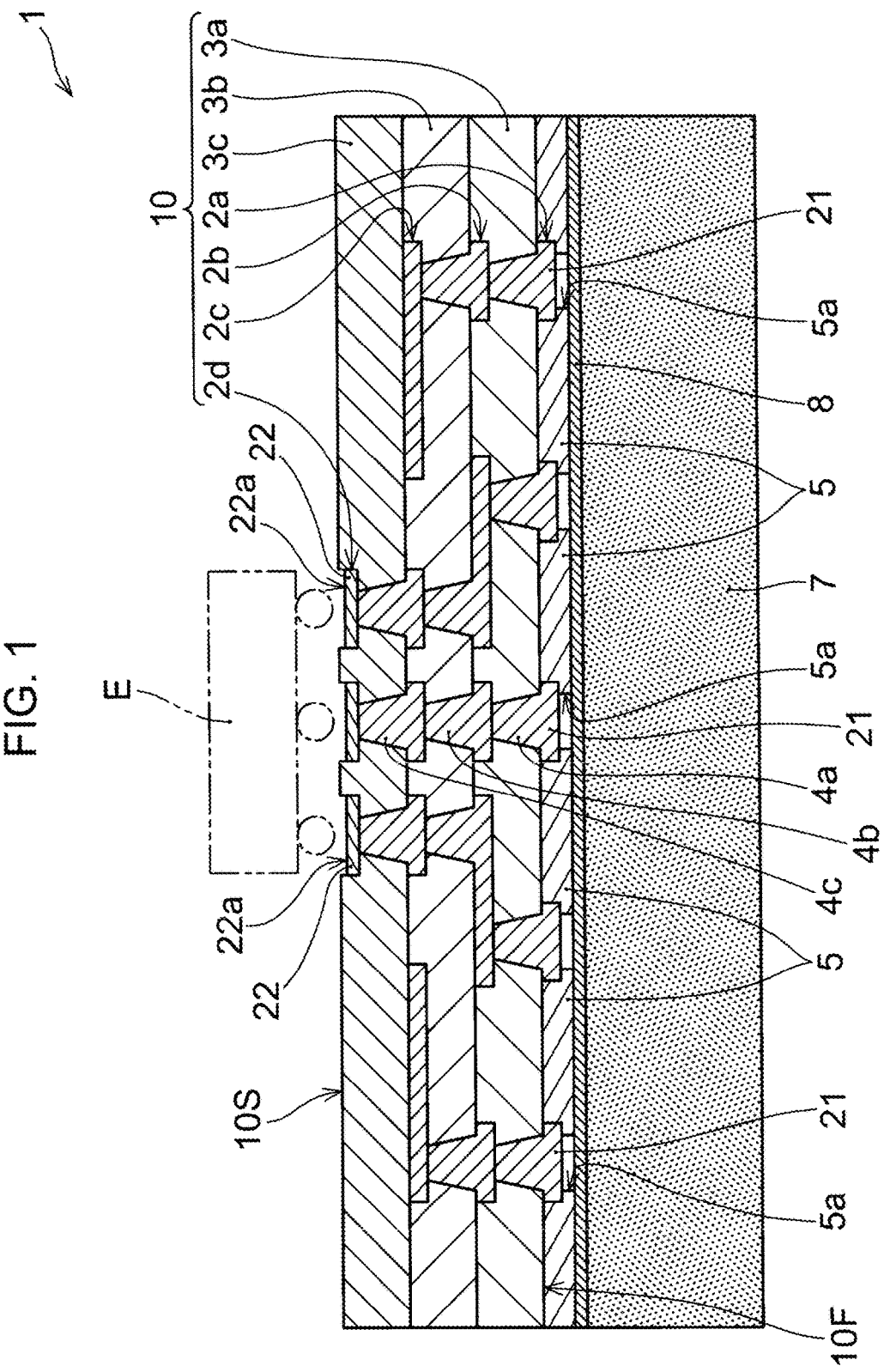
FIG. 1 is a cross-sectional view of a printed wiring board according to an embodiment of the present invention.

Embodiments will now be described with reference to the accompanying drawings, wherein like reference numerals designate corresponding or identical elements throughout the various drawings.

FIG. 1 illustrates a cross-sectional view of an example of a printed wiring board 1 of the embodiment. The printed wiring board 1 includes a laminate 10 formed from alternately laminated conductor layers and resin insulating layers. The laminate 10 includes at least one resin insulating layer and conductor layers formed on both sides of the resin insulating layers. In the example of FIG. 1, the laminate 10 is formed by alternately laminating first-fourth conductor layers (2a, 2b, 2c, 2d) and first-third resin insulating layers (3a, 3b, 3c). The laminate 10 has a first surface (10F) and a second surface (10S) that is on the opposite side of the first surface (10F). The first surface (10F) is formed from a surface of the resin insulating layer (the first resin insulating layer (3a) in the example of FIG. 1) exposed on one side in a lamination direction of the laminate 10, and the second surface (10S) is formed from a surface of the resin insulating layer (the third resin insulating layer (3c) in the example of FIG. 1) exposed on the other side in the lamination direction of the laminate 10. The laminate 10 has multiple first conductor pads 21 formed on the first surface (10F) and multiple second conductor pads 22 formed on the second surface (10S). The second conductor pads 22 are embedded in the third resin insulating layer (3c) that forms the second surface (10S) of the laminate 10, and each have a surface (22a) exposed on the second surface (10S) side. The surfaces (22a) of the second conductor pads 22 are recessed from the second surface (10S) of the laminate 10. Further, a solder resist layer 5 is formed on the first surface (10F) of the laminate 10. The solder resist layer 5 has openings (5a) that respectively expose the first conductor pads 21. A support plate 7 is provided on the first surface (10F) of the laminate 10 via the solder resist layer 5.

The first conductor pads 21 are formed in the first conductor layer (2a) that is positioned on the most first surface (10F) side among the conductor layers of the laminate 10. The second conductor pads 22 are formed in the fourth conductor layer (2d) that is positioned on the most second surface (10S) side among the conductor layers of the laminate 10. The second conductor pads 22 can be connected to an external electrical circuit. For example, an electronic component (E) or an external wiring board (not illustrated in the drawings) is connected to the second conductor pads 22. Examples of the electronic component (E) include a bare chip of a semiconductor element, a WLP, and integrated circuit devices of other forms. Examples of the external wiring board include a motherboard of an electrical device in which the printed wiring board 1 is used, a wiring board of a package of an external electronic component.

In the printed wiring board 1 of the embodiment, the support plate 7 is provided on the first surface (10F) of the laminate 10. Therefore, warpage or deflection of the printed wiring board 1 is suppressed. For example, when the electronic component (E) is mounted on the second conductor pads 22 formed on the second surface (10S) of the laminate 10, multiple electrodes of the electronic component (E) can be respectively substantially uniformly brought close to the multiple second conductor pads 22. The electrodes of the electronic component (E) are unlikely to float from the second conductor pads 22. Since flatness of the second surface (10S) of the laminate 10 is maintained, positional deviation of the electronic component (E) is unlikely to occur. Further, in such a component mounting process and in a manufacturing process of the printed wiring board 1 itself, the printed wiring board 1 can be easily handled.

As will be described later, the support plate 7 can be provided on the first surface (10F) after the conductor layers and the resin insulating layers in the laminate 10 are formed. Therefore, the support plate 7 can be attached to the laminate 10, for example, after performing an energization inspection of an electrical circuit (not illustrated in the drawings) formed by conductor patterns of the conductor layers. That is, it is possible to provide a support plate 7 only for a laminate 10 that is determined to be non-defective by an energization inspection. Then, the electronic component (E) can be mounted on the laminate 10 that is supported by the support plate 7 and has proper energizing performance.

Specifically, terminals of the electronic component (E) of the like connected to the second conductor pads 22 are connected to the exposed surfaces (22a) of the second conductor pads 22 via a bonding material (not illustrated in the drawings) such as solder. In the present embodiment, the surfaces (22a) of the second conductor pads 22 are recessed from the second surface (10S) of the laminate 10. That is, insulating partition walls due to the third resin insulating layer (3c) that forms the second surface (10S) are interposed between the second conductor pads 22. Therefore, wet spreading of solder or the like provided on the second conductor pads 22 is suppressed. A short-circuit defect is unlikely to occur between adjacent second conductor pads 22. In the example of FIG. 1, the second surface (10S) of the laminate 10 is exposed without being covered by a solder resist. In this way, even when a solder resist layer is not formed on the second surface (10S) and even when the second conductor pads 22 are arrayed at a fine pitch, an electronic component or the like can be connected with good quality on the second surface (10S). As will be described later, according to a method for manufacturing the printed wiring board of the embodiment, the fourth conductor layer (2d) including the second conductor pads 22 can be formed, for example, by electroplating only without etching. Therefore, the second conductor pads 22 can be formed at a fine pitch. Therefore, the structure of the printed wiring board 1 that can suppress a short-circuit defect by having the surfaces (22a) of the second conductor pads 22 recessed from the second surface (10S) of the laminate 10 is particularly beneficial.

The first conductor pads 21 are formed on the first surface (10F) without being embedded in the first resin insulating layer (3a) that forms the first surface (10F) of the laminate 10. In the example of FIG. 1, the first conductor pads protrude on the first surface (10F). The first conductor pads 21 can also be connected to an external electrical circuit such as an electronic component or a motherboard. As illustrated in FIG. 1, the printed wiring board 1 has the solder resist layer 5 on the first surface (10F) of the laminate 10. Therefore, in connection between the first conductor pads 21 and an external electrical circuit, occurrence of a short-circuit defect due to solder or the like between the first conductor pads 21 is suppressed.

In this way, in the present embodiment, a short-circuit defect due to solder or the like can be suppressed on both the surface on one side (for example, the first surface (10F) of the laminate 10) and the surface on the other side (for example, the second surface (10S) of the laminate 10). Further, the second conductor pads 22 and an external electrical circuit can be connected on the printed wiring board 1 having good flatness by being supported by the support plate 7. An electrical device using the printed wiring board 1 of the embodiment and having high connection quality can be obtained. As will be described below, the support plate 7 is preferably adhered to the solder resist layer 5 via an adhesive layer 8 that does not develop a strong adhesive force between the support plate 7 and the solder resist layer 5. When the first conductor pads 21 are connected to an external electrical circuit, before the connection, the support plate 7 can be removed. Or, it is also possible that only predetermined first conductor pads 21 connected to the external electrical circuit are exposed.

The laminate 10 has a laminated structure similar to that of a so-called build-up part in a build-up wiring board. In the laminate 10 of FIG. 1, the conductor layers and the resin insulating layers are laminated in the order of, from the first surface (10F) side, the first conductor layer (2a), the first resin insulating layer (3a), the second conductor layer (2b), the second resin insulating layer (3b), the third conductor layer (2c), the third resin insulating layer (3c), and the fourth conductor layer (2d). However, the laminate 10 of the printed wiring board of the embodiment can be formed of any number of conductor layers and resin insulating layers. For example, the laminate 10 may include only one resin insulating layer and conductor layers that are respectively provided on both sides the resin insulating layer, or may include more than four conductor layers. Further, it is also possible that the laminate 10 is formed by laminating some conductor layer and a resin insulating layer at one time rather than forming the conductor layer and the resin insulating layer one by one as in a build-up wiring board.

The conductor layers in the laminate 10 each have conductor patterns formed by patterning pads, wirings and the like into predetermined shapes. The conductor layers are each formed of a good conductive material such as copper. The resin insulating layers in the laminate 10 are not particularly limited as long as the resin insulating layers are insulating and each of them has adhesion to a conductor layer, an appropriate thermal expansion coefficient, and the like. For example, an epoxy resin can be used in the formation of the resin insulating layers.

As illustrated in FIG. 1, the laminate 10 has multiple first-third via conductors (4a, 4b, 4c) that respectively penetrate the first-third resin insulating layers (3a, 3b, 3c). The first via conductors (4a) electrically connect the conductor patterns (for example, the first conductor pads 21) in the first conductor layer (2a) and the conductor patterns in the second conductor layer (2b). Similarly, the second via conductors (4b) connect the conductor patterns in the second conductor layer (2b) and the conductor patterns in the third conductor layer (2c); and the third via conductors (4c) connect the conductor patterns in the third conductor layer (2c) and the conductor patterns (for example, the second conductor pads 22) in the fourth conductor layer (2d). The via conductors are preferably formed of the same material as the first-fourth conductor layers (2a-2d).

The first-third via conductors (4a, 4b, 4c) are each gradually reduced in diameter from the first surface (10F) side of the laminate 10 toward the second surface (10S) side of the laminate 10. That is, a size of a cross section of each of the via conductors in a plane orthogonal to a thickness direction of the laminate 10 is larger closer to the first surface (10F) side and smaller closer to the second surface (10S) side. Of each of the via conductors, an end surface on second surface (10S) side is smaller than an end surface on the first surface (10F) side. For example, since the second surface (10S) side end surface of each of the third via conductors (4c) is small, the second conductor pads 22 can each be reduced in diameter. Since gaps between the second conductor pads 22 are widened, occurrence of a short-circuit defect is further suppressed. The term "reduced in diameter" is used for convenience only, and a cross-sectional shape of each of the via conductors is not limited to a circle or an ellipse.

In the example of FIG. 1, the solder resist layer 5 is formed between the first conductor pads 21. The solder resist layer 5 covers edges of the first conductor pads 21, and in each of the openings (5a), a central portion of a first conductor pad 21 is exposed. Due to the solder resist layer 5 formed between the first conductor pads 21, a short-circuit defect between the first conductor pads 21 is prevented with a high probability. The solder resist layer 5 can be formed, for example, of a photosensitive epoxy resin or polyimide resin. Different from the example of FIG. 1, it is also possible that a solder resist layer is formed also on the second surface (10S) of the laminate 10.

The support plate 7 is adhered to the solder resist layer 5 by an adhesive that forms the adhesive layer 8. The support plate 7 is formed of a rigid material, and supports the laminate 10 such that warpage or deflection of the printed wiring board 1 can be suppressed. The support plate 7 is formed of, for example, a metal plate, a glass epoxy plate obtained by impregnating a reinforcing material such as glass fiber with an epoxy resin, or a copper-clad laminated plate having a copper foil on both sides of a glass epoxy substrate, or the like. Besides these, any appropriately rigid material can be used for the support plate 7. The support plate 7 has a thickness of, for example, 100 µm or more and 500 µm or less. The laminate 10 is properly supported and the printed wiring board 1 including the support plate 7 does not become extremely thick.

A material that forms the adhesive layer 8 is not particularly limited as long as the material can closely adhere to the support plate 7 and the solder resist layer 5. When a part of the support plate 7 or the entire support plate 7 is removed during use of the printed wiring board 1, a material that has moderate adhesiveness but does not develop a strong adhesive force with respect to the solder resist layer 5 and the first conductor layer (2a) is preferred as the material of the adhesive 8. A material at least capable of developing a stronger adhesive force with respect to the support plate 7 than with respect to the solder resist layer 5 and the first conductor layer (2a) is preferred as the material of the adhesive layer 8. It is also possible that the material that forms the adhesive layer 8 is a material that loses adhesiveness with respect to the solder resist layer 5 and the first conductor layer (2a) due to a specific treatment such as ultraviolet irradiation or heating. For example, an acrylic resin can be used as the material of the adhesive layer 8.

Although not illustrated in the drawings, it is also possible that the support plate 7 and the adhesive layer 8 are provided with openings that communicatively connect with the openings (5a) of the solder resist layer 5 and expose the first conductor pads 21. When an energization inspection of the printed wiring board 1 is performed after the support plate 7 is bonded, it is possible that ease of the energization inspection and defect detection performance are improved. Further, it is also possible that the connection between the first conductor pads 21 and the external electrical circuit becomes easy.

It is also possible that, in addition to the second conductor pads 22, multiple third conductor pads are provided on the second surface (10S) of the laminate 10. The multiple third conductor pads may have an array pitch and/or a size different from those of the multiple second conductor pads 22. Further, the third conductor pads may be provided for connecting to an external element other an electronic component or the like connected to the second conductor pads 22.

Figure 2:
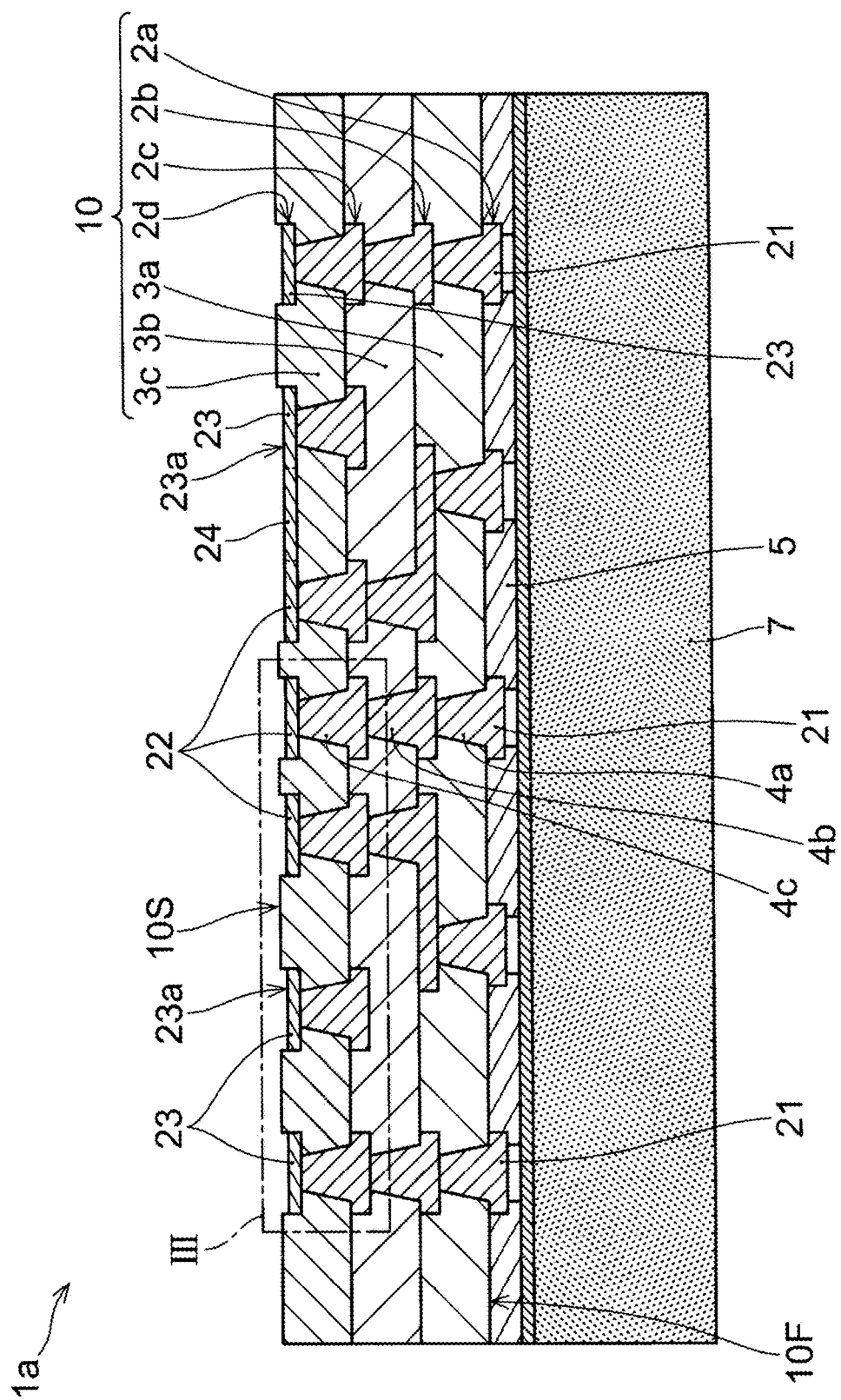
FIG. 2 is a cross-sectional view of a printed wiring board according to another embodiment of the present invention.

FIG. 2 illustrates a printed wiring board (1a) of another example of the embodiment having multiple third conductor pads 23. The printed wiring board (1a) has the same structure as the printed wiring board 1 of FIG. 1 except that the third conductor pads 23 are provided and that, for connecting to the third conductor pads 23, the third and fourth conductor layers (2c, 2d) include conductor patterns different from those of FIG. 1. A structural element that is the same as in the printed wiring board 1 is indicated using the same reference numeral symbol as in FIG. 1, and description about the structural element is omitted.

As illustrated in FIG. 2, the third conductor pads 23 are formed on an outer peripheral side of the second surface (10S) of the laminate 10 than the multiple second conductor pads 22 that are formed in a central portion of the second surface (10S). The multiple third conductor pads 23 can be formed, for example, over the entire circumference of the second conductor pads 22 so as to surround the multiple second conductor pads 22. It is also possible that the multiple third conductor pads 23 are formed only on both sides of the second conductor pads 22 in one direction along the second surface (10S) (for example, a left-right direction in FIG. 2).

The third conductor pads 23 of the printed wiring board (1a), together with the second conductor pads 22, are formed in the fourth conductor layer (2d). Therefore, similar to the second conductor pads 22, the third conductor pads 23 are each covered by the third resin insulating layer (3c) except a surface (23a) on the opposite side of the first surface (10F) of the laminate 10. Similar to the surfaces (22a) of the second conductor pads 22, the surfaces (23a) of the third conductor pads 23 are recessed from the second surface (10S) of the laminate 10. Occurrence of short-circuit defects between the third conductor pads 23 and between the second conductor pads 22 and the third conductor pads 23 is suppressed.

In the printed wiring board (1a) of FIG. 2, some of the second conductor pads 22 and some of the third conductor pads 23 are connected by wiring patterns 24. Similar to the second and third conductor pads (22, 23), the wiring patterns 24 are also formed in the fourth conductor layer (2d). Therefore, the wiring patterns 24 are also embedded in the third resin insulating layer (3c) and only one surface of each of the wiring patterns 24 is exposed on the second surface (10S) side. As in the example of FIG. 2, by providing the wiring patterns 24 in the fourth conductor layer (2d), the second conductor pads 22 and the third conductor pads 23 can be connected with short paths without passing through other conductor layers or via conductors. In the printed wiring board (1a), any number of the second conductor pads 22 and any number of the third conductor pads 23 can be connected by the wiring patterns of the fourth conductor layer (2d).

Figure 3:
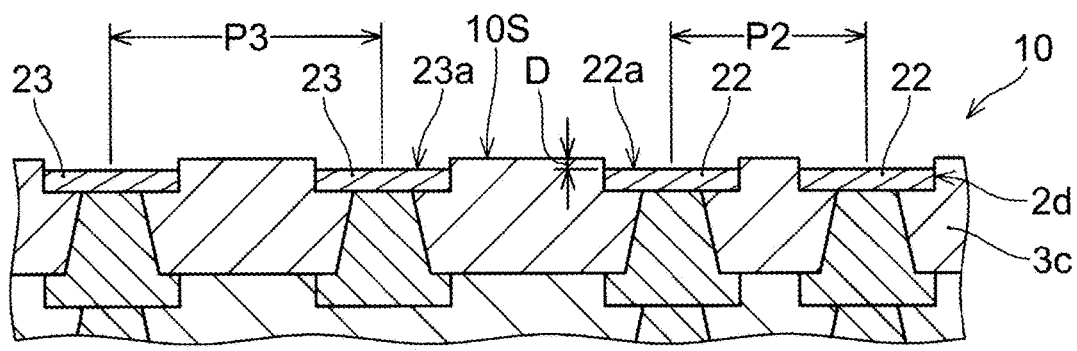
FIG. 3 is an enlarged view of a portion (III) of the printed wiring board of FIG. 2.

FIG. 3 illustrates an enlarged view of a portion (III) surrounded by a one-dot chain line in FIG. 2. A depth (D) the recesses of the surfaces (22a) of the second conductor pads 22 and the surfaces (23a) of the third conductor pads 23 from the second surface (10S) of the laminate 10 is not particularly limited. However, as will be described below, the recesses of the second conductor pads 22 and the like from the second surface (10S) of the laminate 10 are formed, for example, by etching exposed surfaces of the second conductor pads 22 and the like to the second surface (10S) of the laminate 10. Therefore, it is preferable that the depth (D) of the recesses be such that an excessively long etching time is not required. For example, the depth (D) of the recesses of the surfaces (22a, 23a) of the second and third conductor pads (22, 23) from the second surface (10S) is less than 10 μm. From a point of view of obtaining the above-described effect of suppressing a short-circuit defect, the depth (D) of the recesses is preferably 3 μm or more.

As illustrated in FIG. 3, the multiple second conductor pads 22 and the multiple third conductor pads 23 respectively have array pitches (P2, P3). In the example of FIG. 3, the array pitch (P2) of the second conductor pads 22 is smaller than the array pitch (P3) of the third conductor pads 23.

FIG. 4 illustrates an example of a printed wiring board having an electronic component. In the example of FIG. 4, an electronic component (E1) having multiple connection pads (not illustrated in the drawings) arrayed at substantially the same pitch as the second conductor pads 22 of the laminate 10 is mounted on the printed wiring board (1a) of FIG. 2. The connection pads (not illustrated in the drawings) of the electronic component (E1) are connected to the second conductor pads 22 via conductive members (B1) provided on the connection pads. Examples of the conductive members (B1) illustrated in FIG. 4 include solder balls and solder bumps. The conductive members (B1) are not limited to these examples, and can be formed of any other conductive material. Similar to the electronic component (E) of FIG. 1, the electronic component (E1) may be any integrated circuit device such as a bare chip of a semiconductor element, a passive component, or an external wiring board, or the like.

The third conductor pads 23 illustrated in FIG. 4 are not yet connected to an external element, but can be connected to any external element such as an electronic component different from the electronic component (E1). A BGA or the like having a large size has connection pads that are arrayed at a relatively large pitch, and a CSP, a bare chip or the like having a small size has connection pads that are arrayed at a relatively small pitch. For example, a semiconductor element or the like of a CSP or bare chip type is mounted as the electronic component (E1) on the second conductor pads 22. Then, a BGA (not illustrated in the drawings) or the like having terminals only on an outer peripheral portion thereof may be mounted on the third conductor pads 23 having a larger pitch than the second conductor pads 22 in a manner straddling over the electronic component (E1). An electronic component of a package-on-package type including multiple semiconductor devices or the like that are hierarchically mounted can be formed. In this way, in the printed wiring board (1a), electronic components can be mounted at a high density.

An example of a method for manufacturing a printed wiring board of the embodiment is described below with reference to FIG. 5A-5M using the printed wiring board (1a) illustrated in FIG. 2 as an example.

Figure 5A:
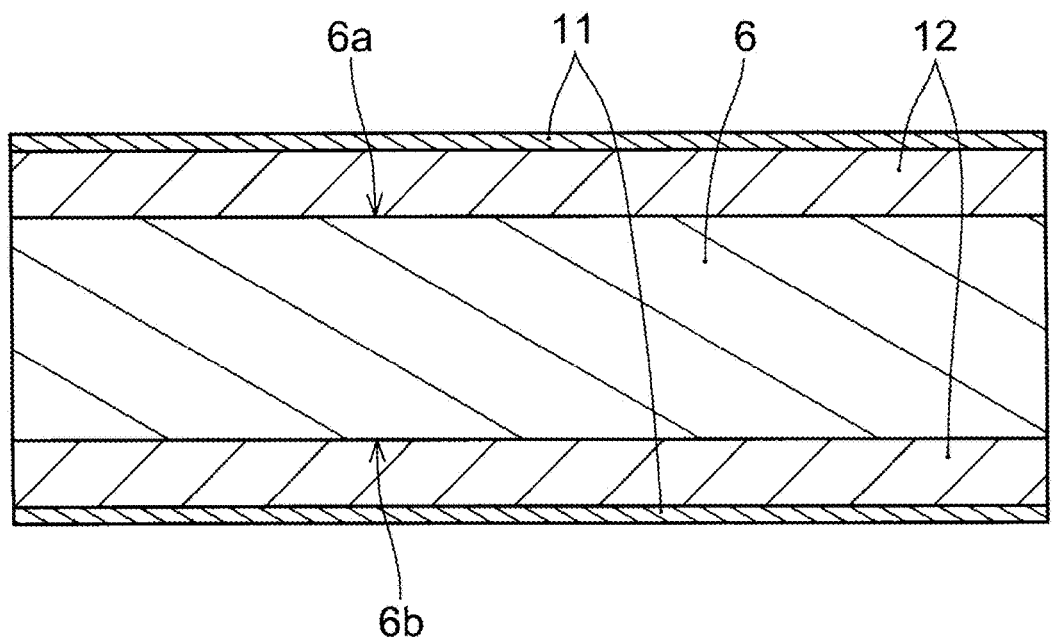
FIG. 5A illustrates an example of a base plate used in a method for manufacturing a printed wiring board according to an embodiment of the embodiment.

As illustrated in FIG. 5A, a base plate 6 is prepared, a metal foil 11 being provided on each surface of the base plate 6. The metal foil 11 has a carrier metal foil 12 adhered to one side of the metal foil 11. A surface of the carrier metal foil 12 on the opposite side of the metal foil 11 is bonded to a surface of the base plate 6 by thermocompression bonding. The metal foil 11 and the carrier metal foil 12 are adhered to each other by, for example, a separable adhesive such as a thermoplastic adhesive. It is also possible that the metal foil 11 and the carrier metal foil 12 are adhered to each other only in a margin portion near an outer periphery. A prepreg, for example, obtained by impregnating a core material such as a glass fiber with a resin material such as an epoxy resin is used for the base plate 6. The prepreg can be fully cured when being thermocompression-bonded to the carrier metal foil 12. It is also possible that a metal plate such as copper plate is used for the base plate 6. Further, it is also possible that a double-sided copper-clad laminated plate is used as the base plate 6 having the carrier metal foil 12. The metal foil 11 and the carrier metal foil 12 are preferably copper foils. Other metal foils such as a nickel foil may also be used. The metal foil 11 has a thickness of, for example, 3 μm or more and 10 μm or less. In FIG. 5A-5M, it is not intended to illustrate exact ratios of thicknesses of the structural elements.

In the example of FIG. 5A, the metal foil 11 is provided on both one surface (6a) and the other surface (6b), which is on the opposite side of the one surface (6a), of the base plate 6. The laminate 10 (see FIG. 2) can be simultaneously formed on both front and back sides of the base plate 6. The printed wiring board (1a) can be efficiently manufactured. However, the metal foil 11 is not necessarily required to be provided on both front and back sides of the base plate 6. In FIG. 5B-5J and the following description, illustration and description with respect to the other surface (6b) side of the base plate 6 are omitted. Further, in FIG. 5B-5J, only one laminate 10 on the one surface (6a) side of the base plate 6 is illustrated. However, it is also possible that multiple laminates 10 are respectively formed on the one surface (6a) side and the other surface (6b) side of the base plate 6.

Figure 5B:
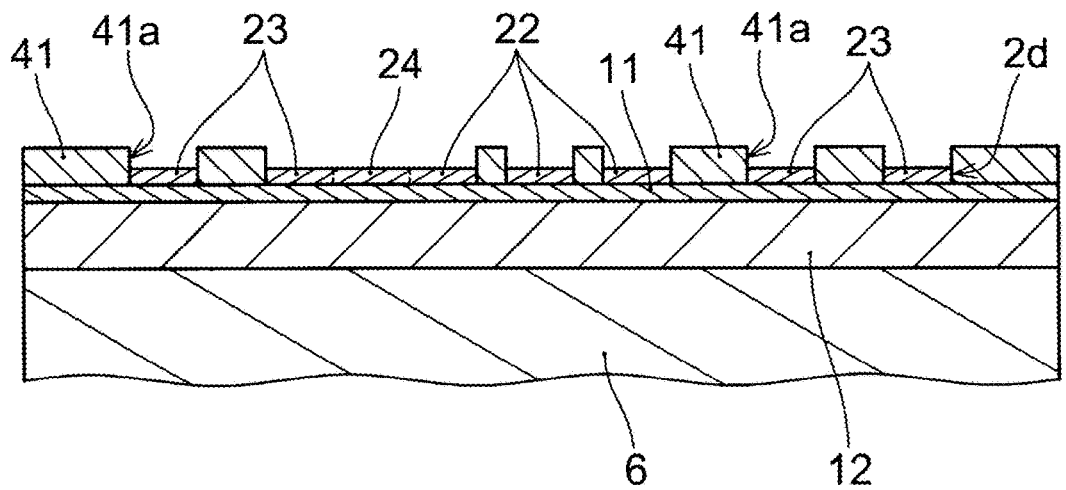
FIG. 5B illustrates an example of formation of a conductor layer on the base plate in the method for manufacturing the printed wiring board of the embodiment.

In the method for manufacturing the printed wiring board of the embodiment, the laminate 10 is formed from the fourth conductor layer (2d) side. First, as illustrated in FIG. 5B, a plating resist 41 for forming the fourth conductor layer (2d) is formed on the metal foil 11. In the plating resist 41, openings (41a) are formed in formation regions of the conductor patterns of the fourth conductor layer (2d), for example, using a photolithography technology. Then, by electrolytic plating using the metal foil 11 as a seed layer, an electrolytic plating film is formed in the openings (41a). As a result, the fourth conductor layer (2d) including the predetermined conductor patterns is formed on the metal foil 11 from the electrolytic plating film in the openings (41a). Since etching is not used, the second conductor pads 22 and the like can be formed at a fine pitch in the fourth conductor layer (2d). After the formation of the fourth conductor layer (2d), the plating resist 41 is removed. The fourth conductor layer (2d) is preferably formed of the same material as the metal foil 11. As will be described later, one surface of each of the second and third conductor pads (22, 23) can be easily recessed from the second surface (10S) of the laminate 10 (see FIG. 2). It is also possible that the fourth conductor layer (2d) is formed using other methods such as electroless plating.

In the printed wiring board (1a) illustrated in FIG. 2, the fourth conductor layer (2d) includes the multiple second conductor pads 22, the multiple third conductor pads 23 and the wiring patterns 24 (when the printed wiring board 1 illustrated in FIG. 1 is manufactured, the third conductor pads 23 and the wiring patterns 24 are not formed). The third conductor pads 23 are formed on the metal foil 11 on an outer peripheral side than the second conductor pads 22.

Figure 5C:
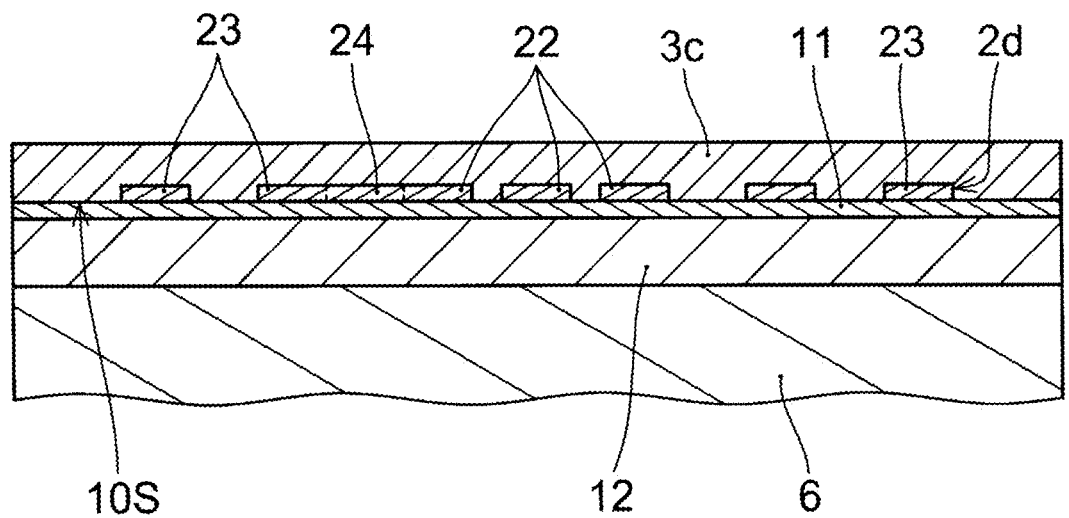
FIG. 5C illustrates an example of formation of a laminate in the method for manufacturing the printed wiring board of the embodiment.

As illustrated in FIG. 5C-5G, the laminate 10 is formed by alternately laminating the resin insulating layers and the conductor layers on the fourth conductor layer (2d). A common method for manufacturing a build-up wiring board can be used. First, as illustrated in FIG. 5C, the third resin insulating layer (3c) covering the fourth conductor layer (2d) is formed on the metal film 11. The third resin insulating layer (3c) is formed, for example, by thermocompression bonding a film-like epoxy resin or the like on the fourth conductor layer (2d) and on exposed portions of the metal foil 11. The third resin insulating layer (3c) forms the second surface (10S) of the laminate 10 (see FIG. 2). The third resin insulating layer (3c) is formed so as to cover the second conductor pads 22, the third conductor pads 23 and the wiring patterns 24 except their surfaces on the metal foil 11 side.

Figure 5D:
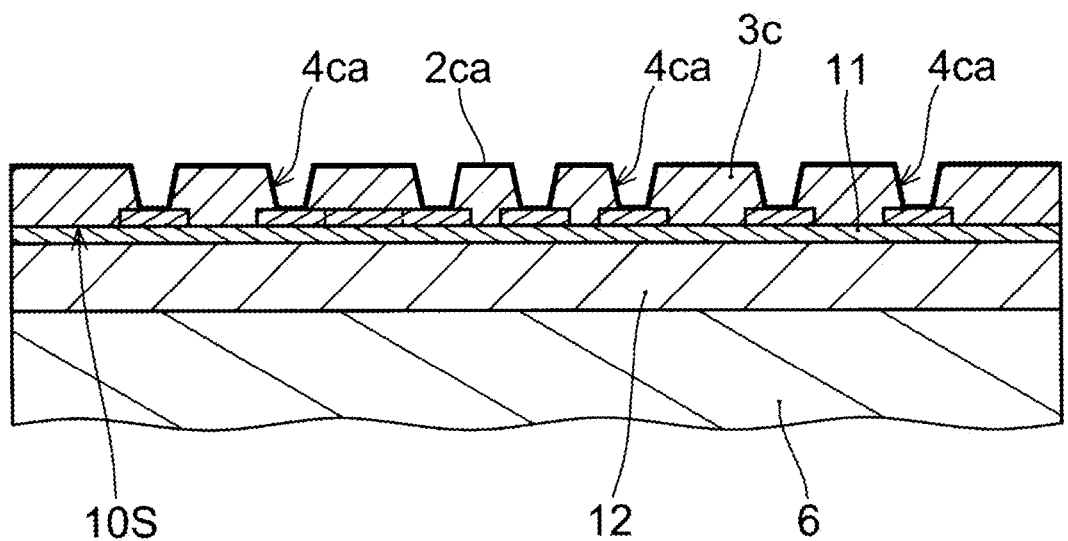
FIG. 5D illustrates an example of the formation of the laminate in the method for manufacturing the printed wiring board of the embodiment.

As illustrated in FIG. 5D, conduction holes (4ca) penetrating the third resin insulating layer (3c) are respectively formed at formation locations of the third via conductors (4c) (see FIG. 2). For example, CO2 laser is irradiated to predetermined positions on the third resin insulating layer (3c). By irradiating laser to the third resin insulating layer (3c) from the opposite side of the base plate 6, the conduction holes (4ca) are formed each having a tapered shape that is gradually reduced in diameter toward the second surface (10S) side. Subsequently, a metal layer (2ca) is formed in the conduction holes (4ca) and on a surface of the third resin insulating layer (3c) by electroless plating or sputtering or the like.

Figure 5E:
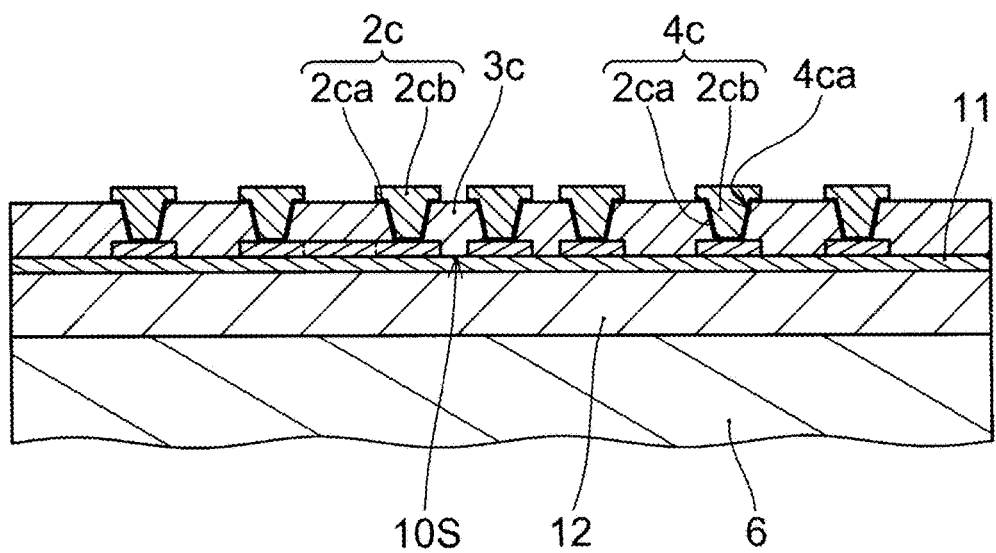
FIG. 5E illustrates an example of the formation of the laminate in the method for manufacturing the printed wiring board of the embodiment.

As illustrated in FIG. 5E, an electrolytic plating film (2cb) is formed by electrolytic plating using the metal layer (2ca) as a seed layer. The electrolytic plating film (2cb) is formed using a so-called pattern plating method or the like using a plating resist (not illustrated in the drawings) that has predetermined openings at formation regions of the conductor patterns of the third conductor layer (2c) and at positions of the conduction holes (4ca). After the formation of the electrolytic plating film (2cb), the plating resist (not illustrated in the drawings) is removed. Then, portions of the metal layer (2ca) that are exposed by the removal of the plating resist and are not covered by the electrolytic plating film (2cb) are removed by etching. As a result, the third conductor layer (2c) is formed by the metal layer (2ca) on the third resin insulating layer (3c) and the electrolytic plating film (2cb) on the third resin insulating layer (3c) and on the conduction holes (4ca). Further, the third via conductors (4c) are formed by the metal layer (2ca) and the electrolytic plating film (2cb) in the conduction holes (4ca). Since the conduction holes (4ca) each have a tapered shape that is gradually reduced in diameter toward the second surface (10S) side, along the shape of the conduction holes (4ca), the third via conductors (4c) each having a shape that is gradually reduced in diameter toward the second surface (10S) side can be formed.

Figure 5F:
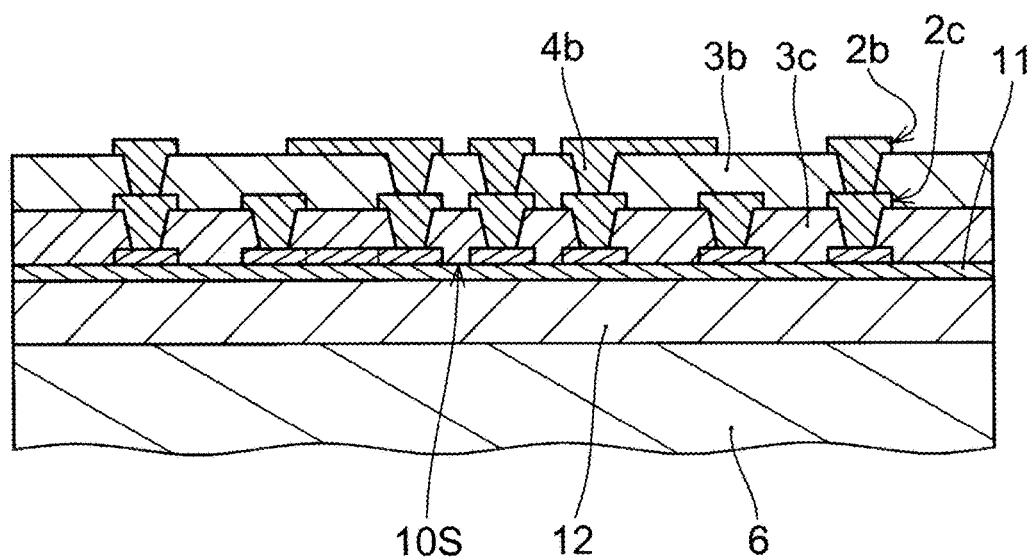
FIG. 5F illustrates an example of the formation of the laminate in the method for manufacturing the printed wiring board of the embodiment.

As illustrated in FIG. 5F, by repeating processes similar to the processes of FIG. 5C-5E, the second resin insulating layer (3b), the second conductor layer (2b), and the second via conductors (4b) are formed on the third conductor layer (2c) and the third resin insulating layer (3c), the second via conductors (4b) each having a shape that is gradually reduced in diameter toward the second surface (10S) side. In FIG. 5F, the third conductor layer (2c) and the second conductor layer (2b) are each simplified as one layer in the illustration. In FIG. 5G-5K, the conductor layers are also similarly simplified in the illustration.

Figure 5G:
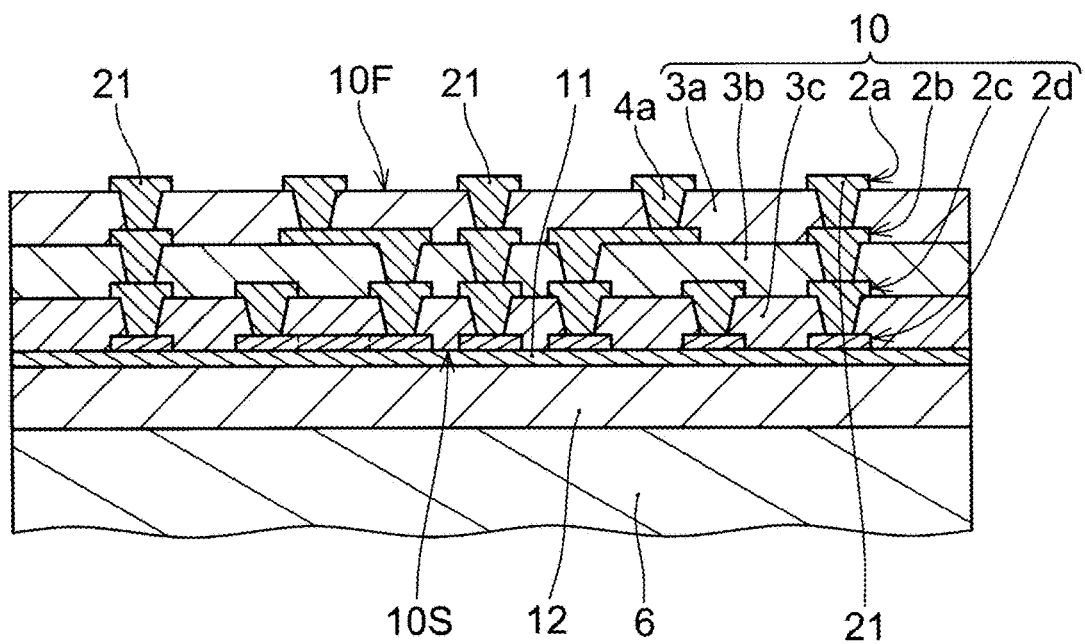
FIG. 5G illustrates an example of the formation of the laminate in the method for manufacturing the printed wiring board of the embodiment.

Further, by repeating processes similar to the processes of FIG. 5C-5E, as illustrated in FIG. 5G, the first resin insulating layer (3a), the first conductor layer (2a) and the first via conductors (4a) are formed on the second resin insulating layer (3b) and the second conductor layer (2b), the first via conductors (4a) each having a shape that is gradually reduced in diameter toward the second surface (10S) side.

By the above formation of the conductor layers and the resin insulating layers, the laminate 10 is formed on the metal foil 11. The laminate 10 includes the fourth conductor layer (2d) formed on the metal foil 11, and has the second surface (10S) on the metal foil 11 side and the first surface (10F) on the opposite side of the second surface (10S). The multiple first conductor pads 21 are formed in the first conductor layer (2a) positioned on the most first surface (10F) side. The multiple first conductor pads 21 are formed protruding on the first surface (10F). When the printed wiring board (1a) has a different number of conductor layers from the laminate 10 illustrated in FIG. 2, the number of repetitions of the processes illustrated in FIG. 5C-5E is appropriately adjusted. For example, when a printed wiring board having only one resin insulating layer and conductor layers provided on both sides of the resin insulating layer is manufactured, the processes of FIG. 5C-5E are not repeated.

Materials for the first-fourth conductor layers (2a-2d) and the first-third via conductors (4a-4c) are not particularly limited as long as the materials have good conductivity and allow the first-fourth conductor layers (2a-2d) and the first-third via conductors (4a-4c) to be easily formed by plating and can be easily removed by etching. Examples of the materials for the conductor layers and the via conductors include copper, nickel and the like, and copper is preferably used. As described above, materials for the first-third resin insulating layers (3a-3c) are not particularly limited as long as the materials have good insulating properties and the like. In addition to the epoxy resin described above, bismaleimide triazine resin (BT resin), phenol resin and the like can be used. A resin material forming the resin insulating layers may contain inorganic filler such as silica.

Figure 5H:
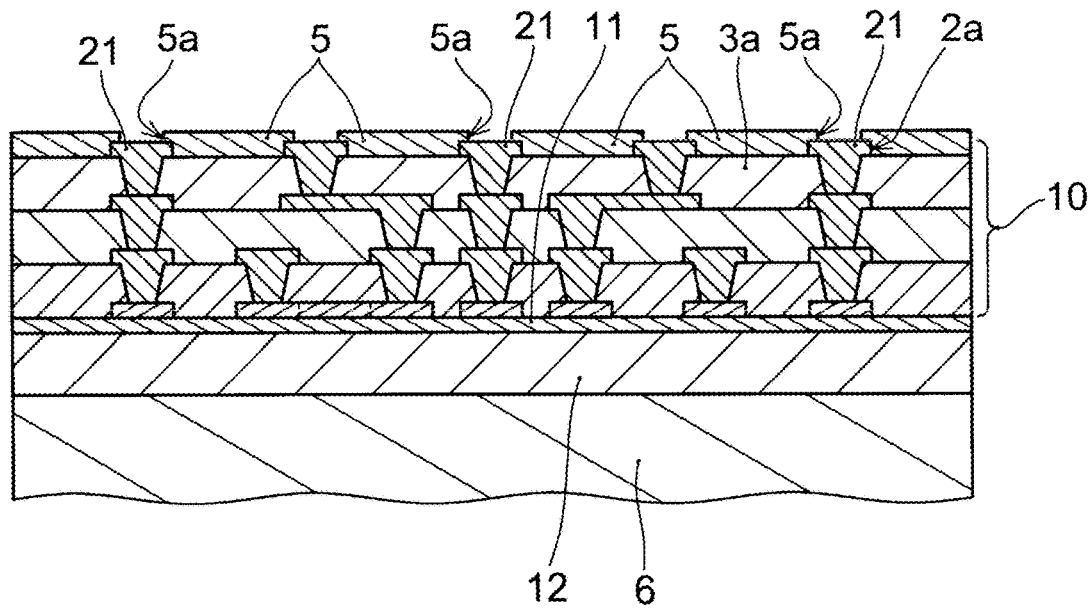
FIG. 5H illustrates an example of formation of a solder resist layer in the method for manufacturing the printed wiring board of the embodiment.

As illustrated in FIG. 5H, the solder resist layer 5 having the openings (5a) on the first conductor pads 21 is formed. The solder resist layer 5 is formed on the surface of the first resin insulating layer (3a) exposed without being covered by the first conductor layer (2a) and on the outer edge portions of the first conductor pads 21. For example, a layer of a photosensitive epoxy resin is formed on the first conductor layer (2a) and on the first resin insulating layer (3a) by printing, spray coating or the like, and the openings (5a) are formed using a photolithography technology.

Figure 5I:
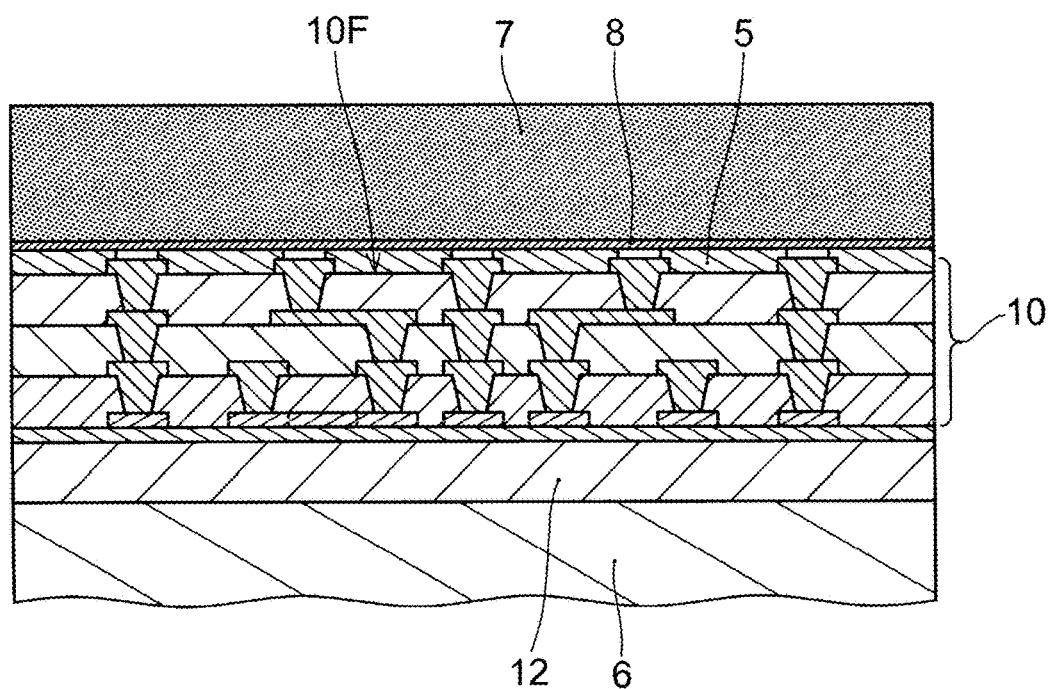
FIG. 5I illustrates an example of a process of providing a support plate in the method for manufacturing the printed wiring board of the embodiment.

As illustrated in FIG. 5I, the support plate 7 is provided on the first surface (10F) of the laminate 10 via the solder resist layer 5. The support plate 7 supports the laminate 10 after removal of the base plate 6 described later. As described above, a glass epoxy board or the like is used for the support plate 7. The adhesive layer 8 having adequate adhesiveness (adhesion) with respect to the solder resist layer 5 is provided on a bonding surface of the support plate 7 and/or the solder resist layer 5. Due to the adhesiveness of the adhesive layer 8, the support plate 7 and the solder resist layer 5 are adhered to each other. When necessary, the adhesive layer 8 is cured by heating or the like.

Figure 5J:
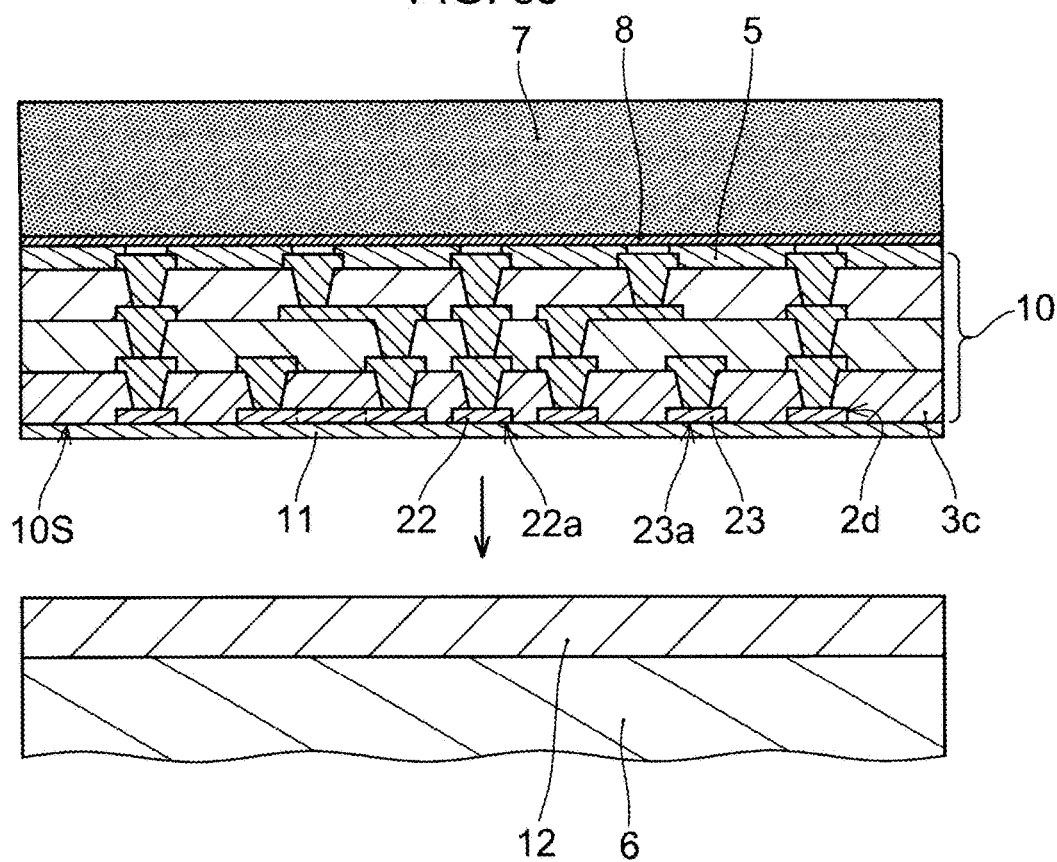
FIG. 5J illustrates an example of removal of the base plate in the method for manufacturing the printed wiring board of the embodiment.

As illustrated in FIG. 5J, the base plate 6 and the laminate 10 are separated from each other, and the base plate 6 is removed. Specifically, the carrier metal foil 12 bonded to the base plate 6 is separated from the metal foil 11. That is, the base plate 6 and the laminate 10 are separated from each other such that the metal foil 11 remains on the second surface (10S) of the laminate 10. For example, the thermoplastic adhesive that adheres the metal foil 11 and the carrier metal foil 12 to each other is softened by heating, and, in this state, the metal foil 11 and the carrier metal foil 12 are pulled apart. When the metal foil 11 and the carrier metal foil 12 are adhered to each other only in an outer peripheral portion, the metal foil 11 and the carrier metal foil 12 may be cut at an inner peripheral side of the adhering portion so that the adhering portion is removed. It is also possible to separate the base plate 6 and the laminate 10 from each other by simply pulling the two in mutually opposite directions. As illustrated in FIG. 5J, by the separation of the carrier metal foil 12 and the metal foil 11 from each other, the metal foil 11 is exposed on the second surface (10S) of the laminate 10.

Figure 5K:
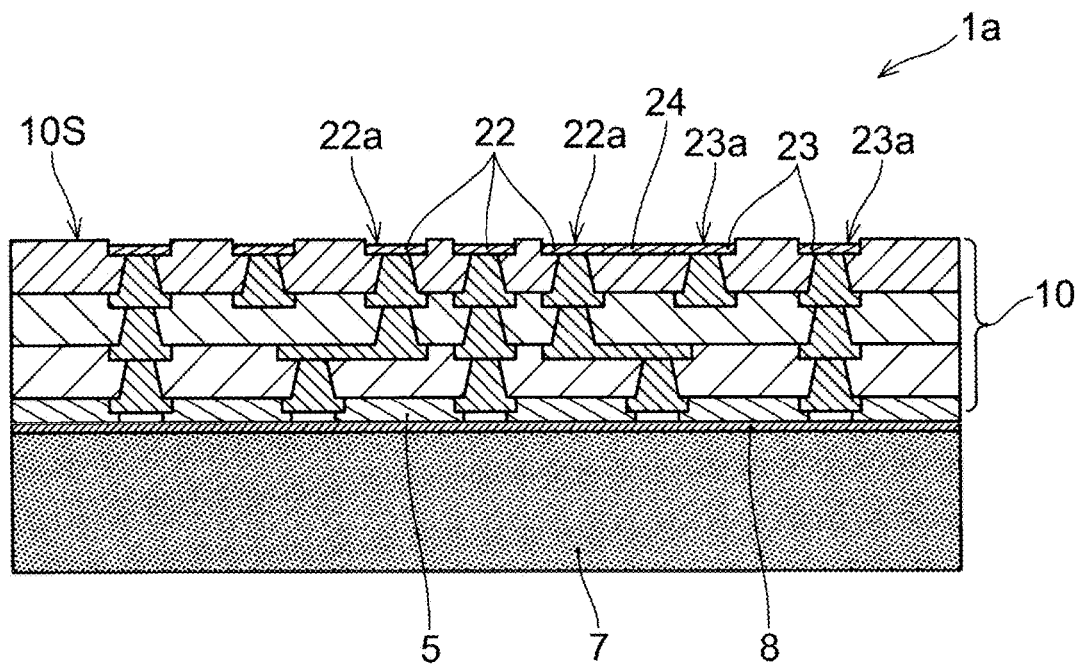
FIG. 5K illustrates an example of removal of a metal foil in the method for manufacturing the printed wiring board of the embodiment.

The metal foil 11 exposed by being separated from the carrier metal foil 12 is removed by etching or the like. Due to the removal of the metal foil 11, the second surface (10S) of the laminate 10 is exposed. At the same time, of the second and third conductor pads (22, 23), the surfaces (22a, 23a) that are not covered by the third resin insulating layer (3c) are also exposed. When the fourth conductor layer (2d) is formed of a material that can be etched with an etching solution for the metal foil 11 (for example, when the fourth conductor layer (2d) and the metal foil 11 are formed of the same material), etching continues even after the metal foil 11 disappears. Or, after the removal of the metal foil 11, the surfaces (22a, 23a) of the second and third conductor pads (22, 23) are etched with an etching solution capable of dissolving the fourth conductor layer (2d). Such over etching is preferable in that the conductor patterns in the fourth conductor layer (2d) can be reliably electrically separated from each other. As a result, as illustrated in FIG. 5K, the second conductor pads 22 and the third conductor pads 23 are respectively formed having the surfaces (22a, 23a) recessed from the second surface (10S) of the laminate 10. In the example of FIG. 5K, the exposed surfaces of the wiring patterns 24 are also recessed from the second surface (10S).

Through the above processes, the printed wiring board (1a) illustrated in FIG. 2 is completed. Although not illustrated in the drawings, a solder resist layer having openings that respectively expose the second conductor pads 22 and the third conductor pads 23 may be formed also on the second surface (10S) of the laminate 10 using the same method as the formation method of the solder resist layer 5. Further, prior to the process of providing the support plate 7, an energization inspection of the laminate 10 may be performed.

Figure 5L:
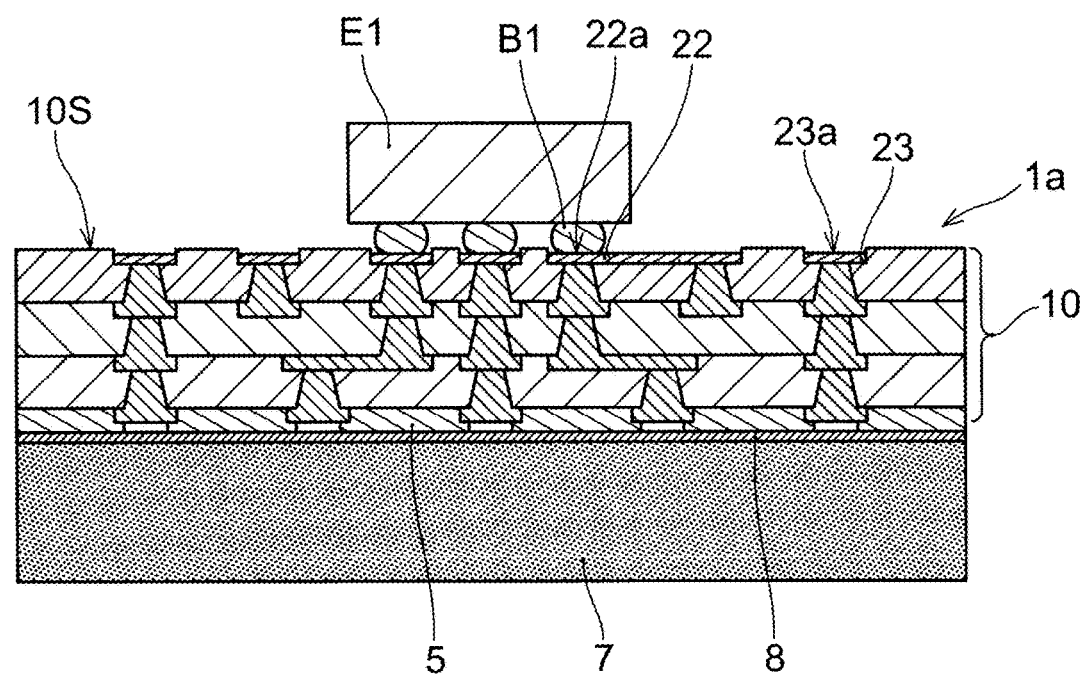
FIG. 5L illustrates an example of mounting an electronic component in the method for manufacturing the printed wiring board of the embodiment.

When the printed wiring board having an electronic component illustrated in FIG. 4 is manufactured, the electronic component (E1) is mounted on the printed wiring board (1a) illustrated in FIG. 5K. As illustrated in FIG. 5L, the electronic component (E1) is positioned on the second surface (10S) of the laminate 10 such that the conductive members (B1) are respectively positioned on the surfaces (22a) of the second conductor pads 22. Prior to the positioning of the electronic component (E1), a bonding material such as a solder paste may be supplied onto the second conductor pads 22. Together with the electronic component (E1), the printed wiring board (1a) is heated in a reflow furnace or a high temperature tank or the like, and the electronic component (E1) is connected to the second conductor pads 22. Since the electronic component (E1) is mounted in a state in which the laminate 10 is supported by the support plate 7, the electronic component (E1) can be properly mounted on the printed wiring board (1a). The printed wiring board having an electronic component illustrated in FIG. 4 is completed.

After the electronic component (E1) is mounted, as illustrated in FIG. 5M, the support plate 7 may be peeled off from the laminate 10. As a result, the first conductor pads 21 are exposed, and connection between an external electrical circuit and the first conductor pads 21 is facilitated. Further, as illustrated in FIG. 5M, a resin sealing layer (M) covering around the electronic component (E1) may be formed. In the where the resin sealing layer (M) is formed, the support plate 7 may be peeled off before the formation of the resin sealing layer (M), or may be peeled off after the formation of the resin sealing layer (M).

As described above, the adhesive layer 8 that closely adheres the support plate 7 and the laminate 10 to each other is preferably formed of a material that does not have strong adhesion with the solder resist layer 5. In this case, the support plate 7 and the laminate 10 can be easily separated from each other by pulling the two in mutually opposite directions. Depending on adhesive properties of the adhesive layer 8, the support plate 7 and the laminate 10 may be separated from each other while ultraviolet irradiation or heating is performed, or after ultraviolet irradiation or heating is performed. After the electronic component (E1) is mounted, the support plate 7 can be removed, for example, at an appropriate timing up to a process of connecting the first conductor pads 21 and an external electrical circuit.

The resin sealing layer (M) can be formed, for example, by supplying a flowable mold resin mainly composed of an epoxy resin or the like to an upper surface and surrounding areas of the electronic component (E1) and applying heat when necessary. The resin sealing layer (M) may be formed using any other method such as laminating and heating a resin film on the electronic component (E1). Further, it is also possible that a so-called underfill-like resin sealing layer, which fills only a gap between the electronic component (E1) and the laminate 10, is formed.

Next, a printed wiring board of another embodiment of the present invention is described with reference to the drawings.

Figure 6:
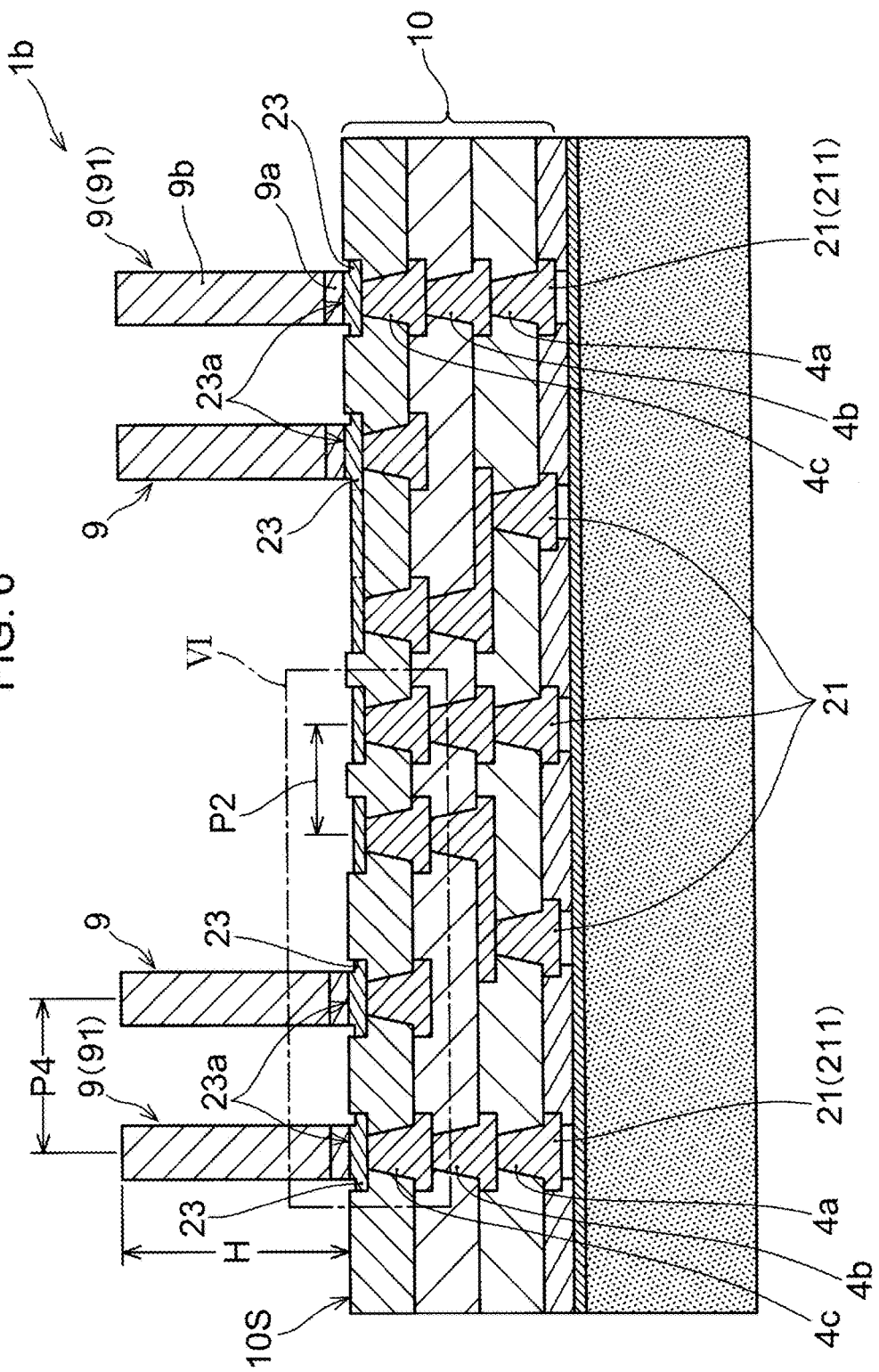
FIG. 6 is a cross-sectional view of a printed wiring board according to another embodiment of the present invention.

FIG. 6 illustrates a cross-sectional view of a printed wiring board (1b) of another embodiment. The printed wiring board (1b) of the present embodiment is different from the printed wiring board (1a) of FIG. 2 in that conductor posts 9 are provided. A structural element that is the same as in the printed wiring boards (1, 1a) of FIGS. 1 and 2 is indicated using the same reference numeral symbol as in FIGS. 1 and 2, and description about the structural element is omitted as appropriate.

As illustrated in FIG. 6, in the printed wiring board (1b), the conductor posts 9 are respectively formed on the surfaces (23a) of the multiple third conductor pads 23. The conductor posts 9 are columnar bodies that are formed of a conductive material and each have an arbitrary bottom surface (end surface) shape. For example, an external electronic component or a wiring board (not illustrated in the drawings) is connected to end surfaces of the conductor posts 9 on the opposite side of the laminate 10. That is, the laminate 10 and an external electrical circuit (not illustrated in the drawings) can be connected to each other via the conductor posts 9.

The conductor posts 9 are each formed from a metal foil layer (9a) and a plating film layer (9b), the metal foil layer (9a) facing the laminate 10 and being in contact with a third conductor pad 23, and the plating film layer (9b) being formed on the metal foil layer (9a). The metal foil layer (9a) is formed of, for example, a metal foil such as a copper foil or a nickel foil. Examples of a material for the plating film layer (9b) include copper, nickel and the like, but are not limited to these. Preferably, the plating film layer (9b) is formed of an electrolytic copper plating film.

The conductor posts 9 can each be formed to have any height according to a required spacing between the laminate 10 and an external electronic component or the like (not illustrated in the drawings). The required spacing between the laminate 10 and an external electronic component or the like is defined, for example, according to a thickness of the electronic component (E) (see FIG. 1) mounted on the second conductor pads 22. For example, a height (H) of each of the conductor posts 9 is 50 μm or more and 200 μm or less. A relatively thick electronic component (E) can be mounted on the second conductor pads 22. Further, the conductor posts 9 can be formed within a relatively short time by electrolytic plating or the like. The height (H) of each of the conductor posts 9 is a distance from an interface between a conductor post 9 and a third conductor pad 23 to a front end surface of the conductor post 9.

The multiple conductor posts 9 have an array pitch (P4). For example, the array pitch (P4) of the conductor posts 9 is substantially the same as the array pitch of the third conductor pads 23. In the example of FIG. 6, the array pitch (P4) of the conductor posts 9 is larger than the array pitch (P2) of the second conductor pads 22.

The conductor posts 9 are connected to predetermined conductor patterns in the laminate via the third conductor pads 23. The conductor posts 9 can be connected to any conductor pads or wiring patterns in any conductor layer in the laminate 10. In the printed wiring board (1b) of FIG. 6, in the drawing, a left-right direction outer side conductor post 91 and a first conductor pad 211 among the multiple first conductor pads 21 are formed at overlapping positions in a plan view, and are connected to each other. The laminate 10 has first-third via conductors (4a, 4b, 4c) that are formed at positions overlapping with the conductor post 91 in a plan view. The conductor post 91 is connected to the first conductor pad 211 via the third via conductor (4c), the second via conductor (4b) and the first via conductor (4a) that are formed at overlapping positions in a plan view. That is, the conductor post 91 and the first conductor pad 211 are connected to each other via a so-called stack via. In particular, in the example of FIG. 6, the first conductor pad 211, the first-third via conductors (4a, 4b, 4c), the third conductor pad 23 and the conductor post 91 are substantially coaxially formed. The conductor post 91 and the first conductor pad 211 can be connected to each other without requiring a lot of area in the conductor layers in the laminate 10. The term "plan view" refers to a way of viewing the printed wiring board (1b) from outside, and means to view the printed wiring board (1b) along a direction parallel to a thickness direction of the printed wiring board (1b).

Figure 7:
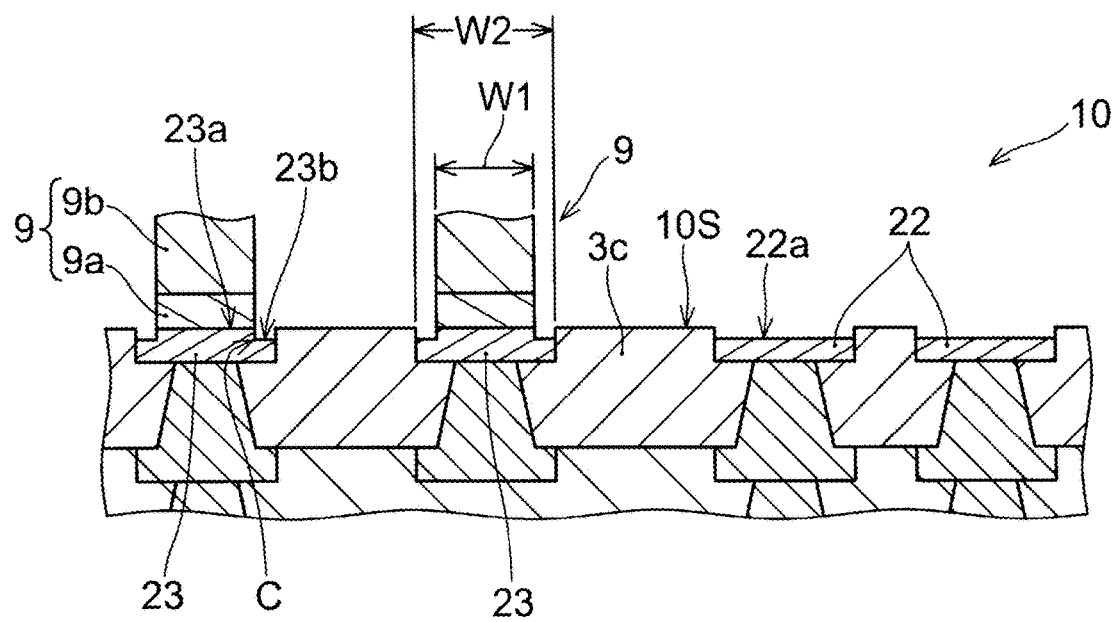
FIG. 7 is an enlarged view of a portion (VI) of the printed wiring board of FIG. 6.

FIG. 7 illustrates an enlarged view of a portion (VI) surrounded by a one-dot chain line in FIG. 6. As illustrated in FIG. 7, the conductor posts 9 each have a width (W1) smaller than a width (W2) of each of the third conductor pads 23. Even when there are some variations in formation positions of the plating film layers (9b), the conductor posts 9 are less likely to protrude from the third conductor pads 23. All of the conductor posts 9 are respectively reliably formed on the third conductor pads 23. For example, a ration (W1/W2) of the width of each of the conductor posts 9 to the width of each of the third conductor pads 23 is 0.6 or more and 0.8 or less. A large margin region does not occur in each of the third conductor pads 23, and all of the conductor posts 9 can be respectively reliably formed on the third conductor pads 23. The width of each of the conductor posts 9 is a longest distance between any two points on an outer circumference of the bottom surface (end surface) of each of the conductor posts 9, and the width of each of the third conductor pads 23 is a longest distance between any two points on an outer circumference of the surface (23a) of each of the third conductor pads 23. For example, when the conductor posts 9 are each a cylindrical body, the width of each of the conductor posts 9 is a diameter of the bottom surface of each of the conductor posts 9.

As illustrated in FIG. 7, since the width of each of the conductor posts 9 is smaller than the width of each of the third conductor pads 23, an upper surface (23b) (surface on a conductor post 9 side) of an outer edge portion of each of the third conductor pads 23 is not covered by a conductor post 9 and is exposed. The upper surface (23b) of the outer edge portion is recessed from the second surface (10S) of the laminate 10. The upper surface (23b) is substantially coplanar with the surfaces (22a) of the second conductor pads 22. On the other hand, an interface between a third conductor pad 23 and a conductor post 9 is substantially coplanar with the second surface (10S) of the laminate 10. That is, the surfaces (23a) of the third conductor pads 23 respectively covered by the conductor posts 9 are substantially flush with the second surface (10S) of the laminate 10. The third conductor pads 23 each have a height difference, on a surface on a conductor post 9 side, between the surface (23a) (which is an upper surface of a central portion) and the upper surface (23b) of the outer edge portion. When a force in a direction crossing the thickness direction of the printed wiring board (1b) is applied to the conductor posts 9, a stress is likely to concentrate on a corner part (C) that is a width transition point of a third conductor pad 23. The corner part (C) exists in each of the integrally formed third conductor pads 23. Therefore, strength against a stress in a vicinity of the corner part (C) is higher than that in a vicinity of an interface between a third conductor pad 23 and a conductor post 9. Reliability of the printed wiring board (1b) is high.

Figure 8:
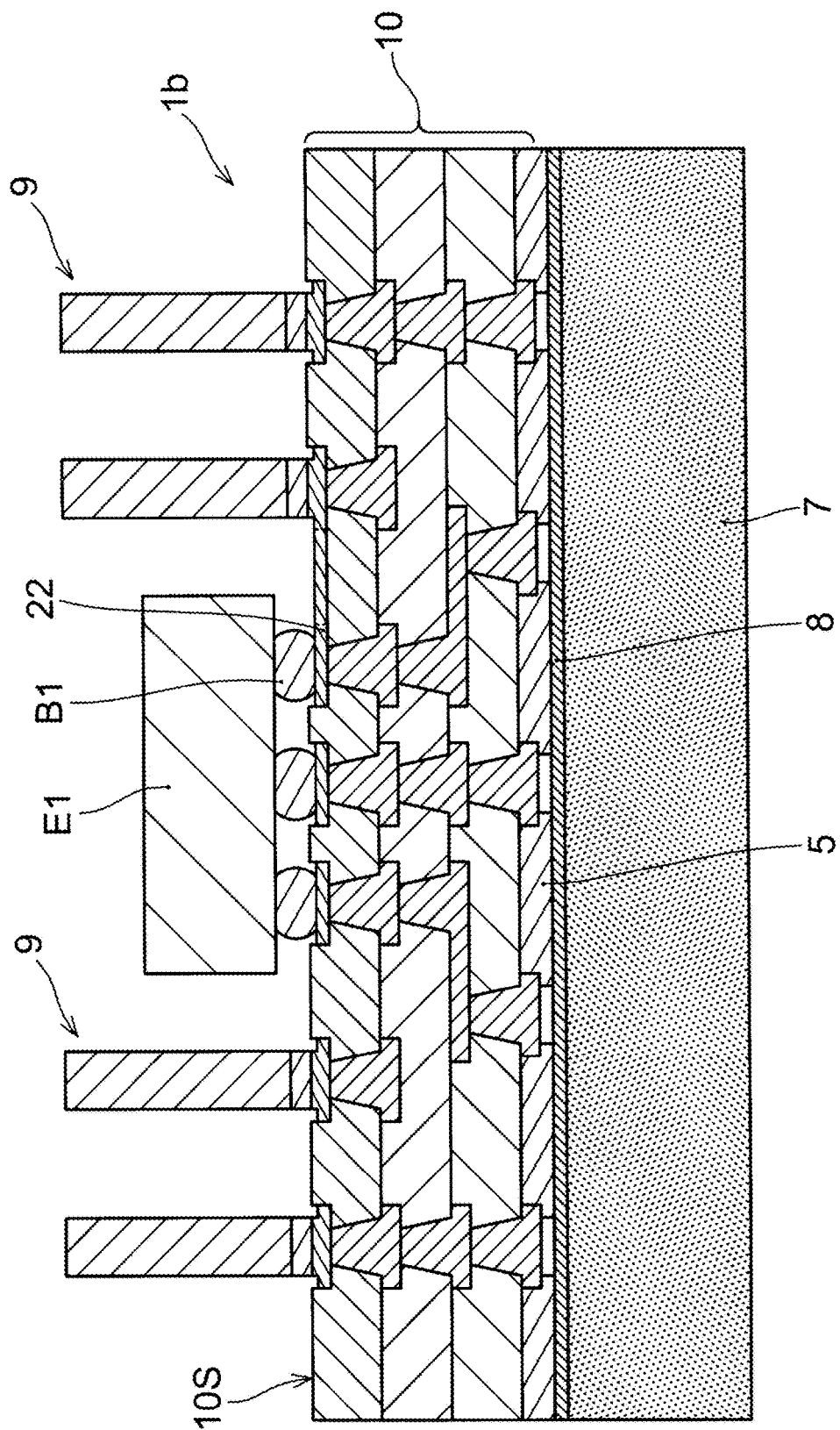
FIG. 8 illustrates a printed wiring board according to an embodiment of the present invention, in which an electronic component is mounted.

For example, similar to the example of FIG. 4, the electronic component (E1) is connected via the conductive members (B1) to the second conductor pads 22 of the printed wiring board (1b) of FIG. 6. As illustrated in FIG. 8, the printed wiring board (1b) having the electronic component (E1) mounted on the second conductor pads 22 can be formed. Then, for example, by connecting an external electronic component such as a semiconductor device to the front end surfaces of the conductor posts 9, an electronic component of a packaged-on-package type including two hierarchically mounted semiconductor devices can be obtained.

Next, an example of a method for manufacturing the printed wiring board (1b) of the other embodiment illustrated in FIG. 6-8 is described with reference to FIG. 9A-9E. First, through the same processes as those illustrated in FIG. 5A-5J, the laminate 10 and the solder resist layer 5 are formed, the support plate 7 is provided, and the base plate 6 is removed. Then, when the printed wiring board (1b) is manufactured, the conductor posts 9 are formed before the removal of the metal foil 11.

Figure 9A:
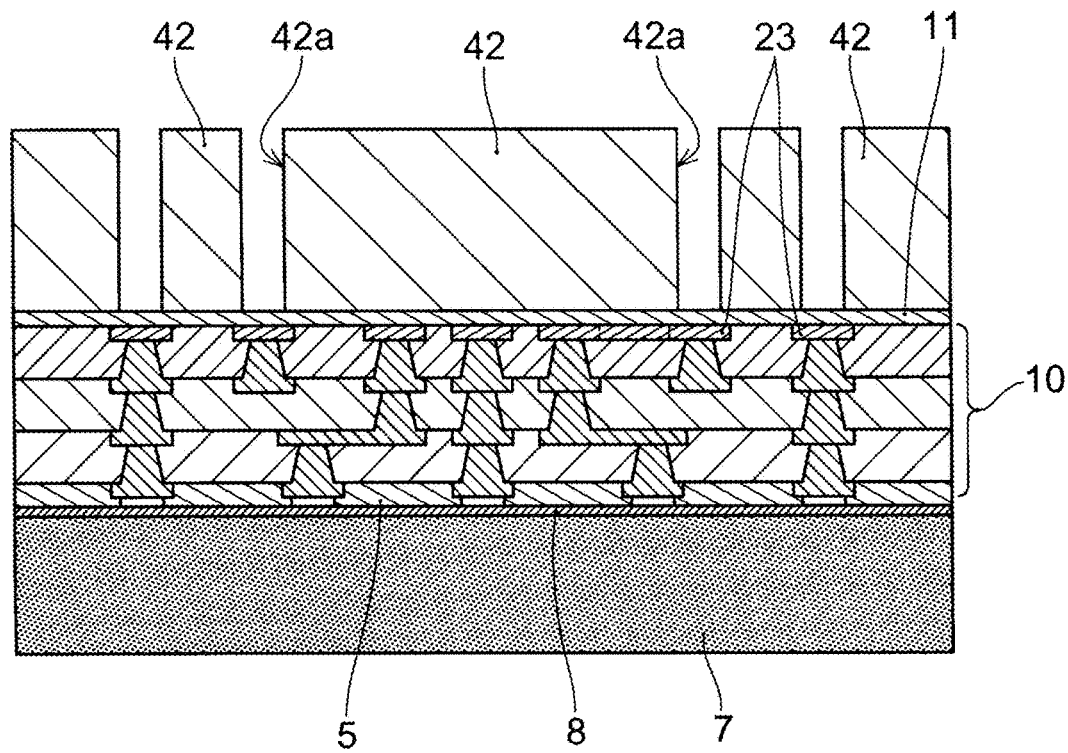
FIG. 9A illustrates an example of a formation process of conductor posts in a method for manufacturing a printed wiring board according to an embodiment of the present invention.
Figure 9B:
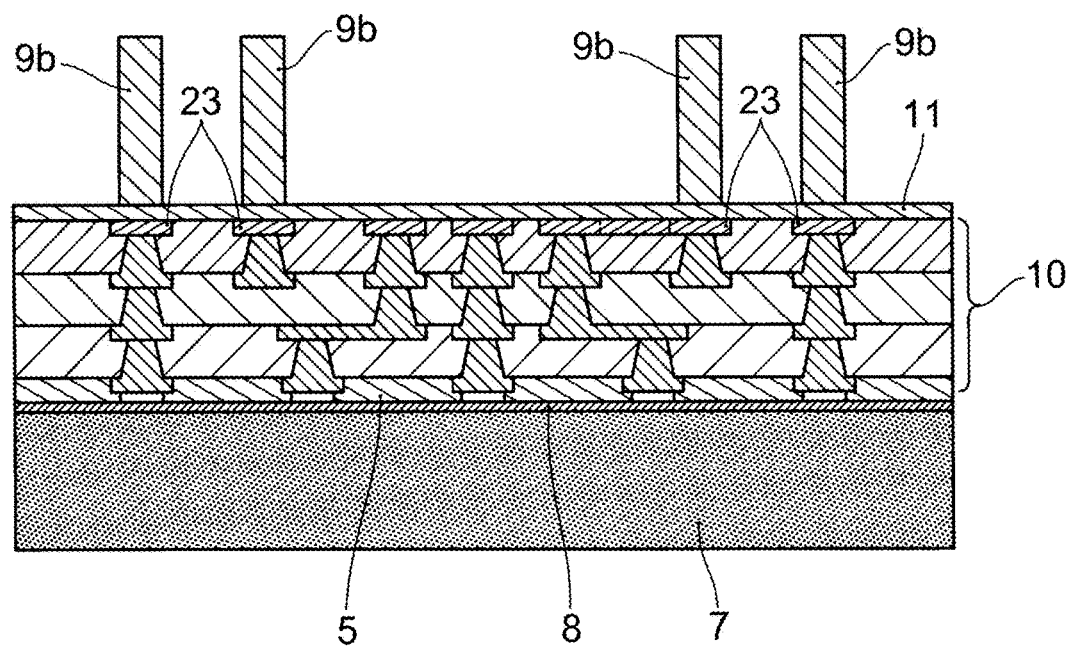
FIG. 9B illustrates an example of a formation process of the conductor posts in the method for manufacturing the printed wiring board of the other embodiment.

As illustrated in FIG. 9A, a plating resist 42 for forming the conductor posts is formed on one surface of the metal foil 11 exposed due to the removal of the base plate 6. Openings (42a) are provided in the plating resist 42 at formation positions of the conductor posts 9, that is, on the third conductor pads 23, for example, using a photolithography technology. Since the width of each of the conductor posts 9 is smaller than the width of each of the third conductor pads 23 in the printed wiring board (1b) of FIG. 6, the openings (42a) are formed to each have an opening width smaller than the width of each of the third conductor pads 23. Subsequently, a plating film is formed in each of the openings (42a) by electrolytic plating using the metal foil 11 as a seed layer, and thereafter, the plating resist 42 is removed. As illustrated in FIG. 9B, the plating film layers (9b) are respectively formed on the third conductor pads 23 via the metal foil 11. The plating film layers (9b) each have a width smaller than the width of each of the third conductor pads 23.

Figure 9C:
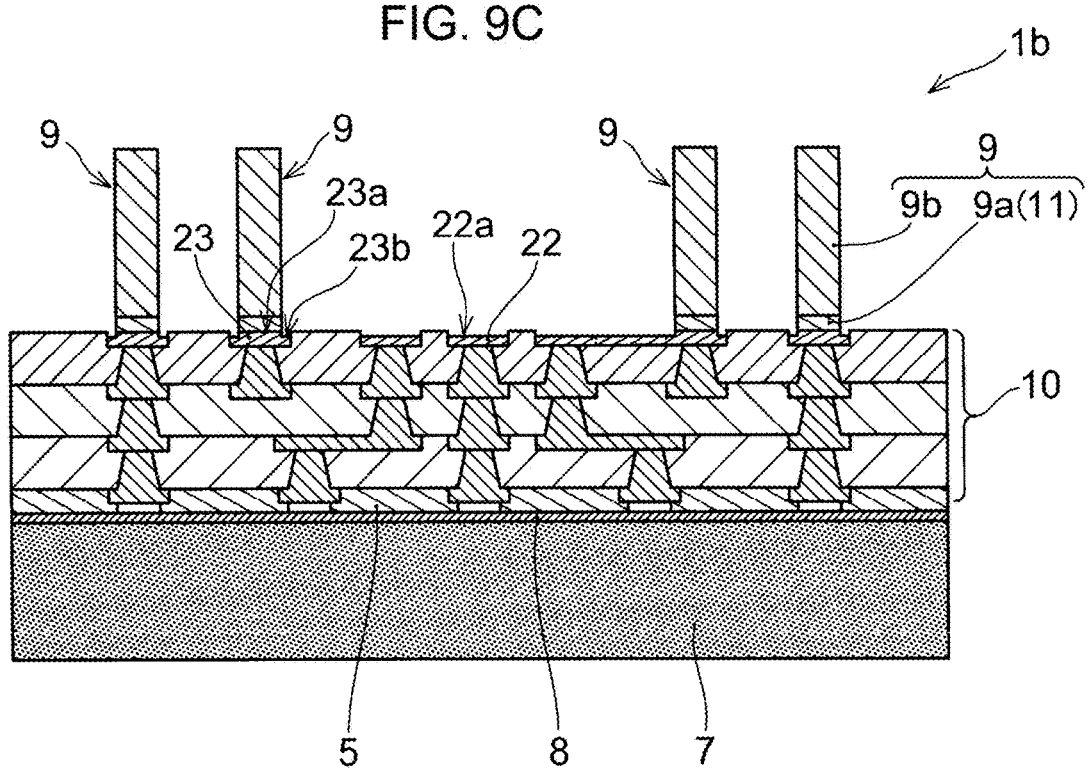
FIG. 9C illustrates an example of removal of a metal foil in the method for manufacturing the printed wiring board of the other embodiment.

As illustrated in FIG. 9C, a portion of the metal foil 11 that is exposed without being covered by the plating film layers (9b) is removed by etching. Portions of the metal foil 11 that are respectively covered by the plating film layers (9b) are not removed and respectively remain between the third conductor pads 23 and the plating film layers (9b). The conductor posts 9 are formed from the metal foil layers (9a), which are the remaining portions of the metal foil 11, and the plating film layers (9b).

Similar to the process illustrated in FIG. 5K, the surfaces (22a) of the second conductor pads 22, which are exposed due to the removal of the metal foil 11, are etched following the metal foil 11. On the other hand, the surfaces (23a) of the third conductor pads 23 are respectively covered by the plating film layers (9b) and thus are not etched. However, the upper surfaces (23b) of the outer edge portions of the third conductor pads 23 are exposed due to the removal of the metal foil 11, and thus are etched in the same manner as the surfaces (22a) of the second conductor pads 22. As a result, the third conductor pads 23 are formed, of which only the upper surfaces (23b) of the outer edge portions exposed on the second surface (10S) side of the laminate 10 are recessed from the second surface (10S). Through the above processes, the printed wiring board (1b) illustrated in FIG. 6 is completed.

FIG. 9A-9C illustrate processes of forming the conductor posts 9 on one support plate 7. However, it is also possible that conductor posts 9 are substantially simultaneously formed on two support plates 7. For example, after the process (see FIG. 5I) of providing the support plate 7 on the laminate 10, and before or after the removal of the base plate 6 (see FIG. 5J), two support plates 7, on which two laminates 10 are provided, are bonded to each other by a peelable adhesive or the like. The two support plates 7 are bonded to each other such that their exposed surfaces on opposite sides of the laminates 10 face each other. Then, the conductor posts 9 are formed using the method described with reference to FIG. 9A-9C on the third conductor pads 23 of each of the laminates 10 on the two bonded support plates 7. Thereafter, the two support plates 7 are separated. The conductor posts 9 can be substantially simultaneously formed on two support plates 7. The conductor posts 9 can be efficiently formed. As described above, in a case where two laminates 10 are respectively formed on both sides of the base plate 6, the support plates 7 of the two laminates 10 separated by removal of the base plate 6 may be bonded to each other.

Figure 9D:
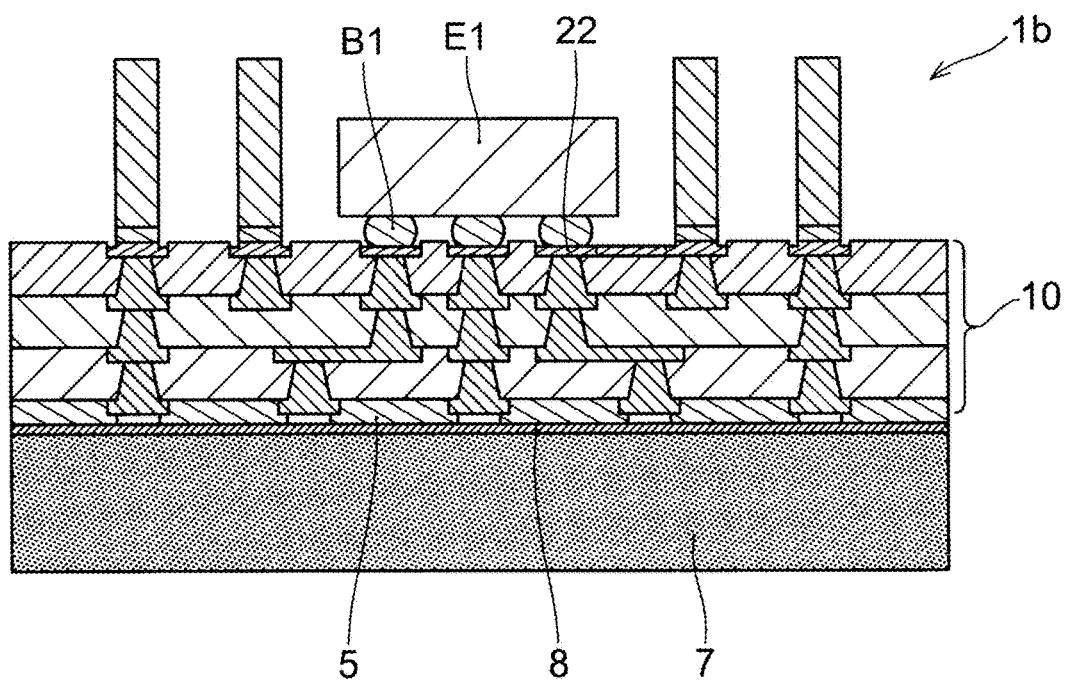
FIG. 9D illustrates an example of mounting an electronic component in the method for manufacturing the printed wiring board of the other embodiment.
Figure 9E:
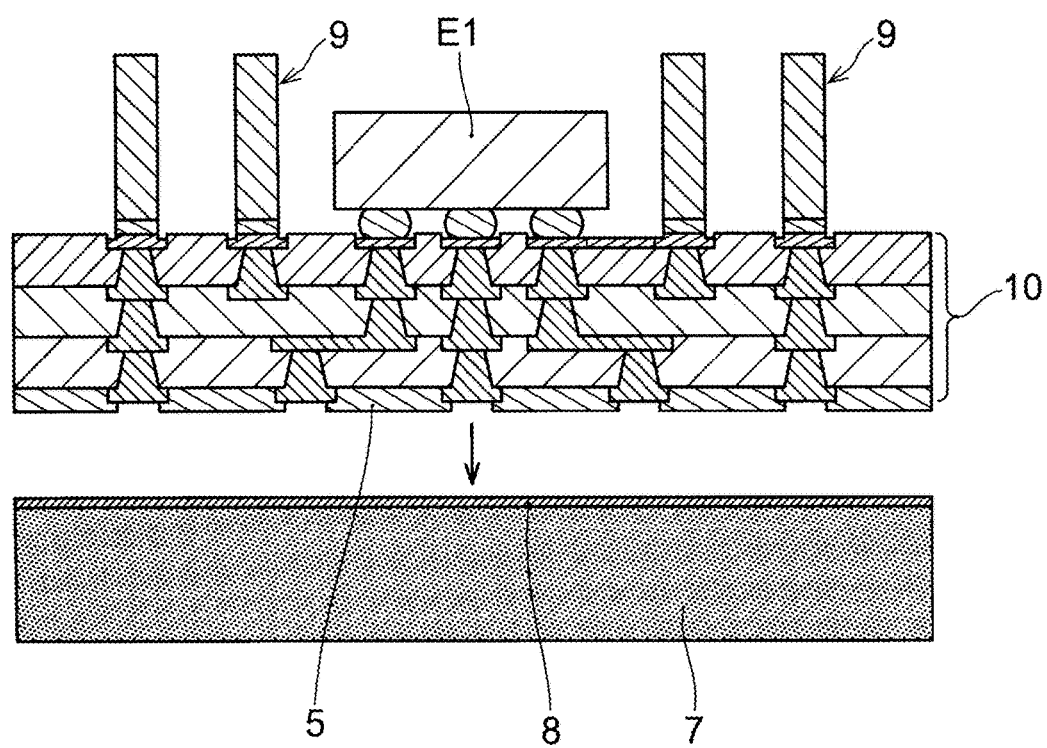
FIG. 9E illustrates an example of removal of a support plate in the method for manufacturing the printed wiring board of the other embodiment.

When the printed wiring board having an electronic component illustrated in FIG. 8 is manufactured, the electronic component (E1) is mounted on the printed wiring board (1b) as illustrated in FIG. 9D. The electronic component (E1) is connected to the second conductor pads 22 via the conductive members (B1) using the same method as that described with reference to FIG. 5L, such as solder reflow. Then, as illustrated in FIG. 9E, the support plate 7 is peeled off from the laminate 10 as appropriate using the same method as that described with reference to FIG. 5M.

The printed wiring board of the embodiment is not limited to the structures illustrated in FIGS. 1, 2 and 6. For example, it is also possible that the array pitch (P2) of the second conductor pads 22 is the same as or larger than the array pitch (P3) of the third conductor pads 23. It is also possible that the first conductor layer (2a) and the fourth conductor layer (2d) include other conductor patterns in addition to the first-third conductor pads (21-23). The first-third via conductors (4a-4c) are not necessarily required to be reduced in diameter toward the second surface (10S) side. It is also possible that the width (W1) of each of the conductor posts 9 is the same as or larger than the width (W2) of each of the third conductor pads 23. Further, it is also possible that a conductor post 9 other than a conductor post 91 (see FIG. 6) and a first conductor pad 21 other than a first conductor pad 211 (see FIG. 6) are connected to each other by a stack via. Conversely, it is also possible that a stack via connecting a conductor post 9 to a first conductor pad 21 is not formed at all. Further, it is also possible that the openings (5a) of the solder resist layer 5 each expose an entire first conductor pad 21. It is also possible that the solder resist layer 5 is formed such that the multiple first conductor pads 21 are collectively exposed on one opening (5a). Further, the method for manufacturing the printed wiring board of the embodiment is not limited the methods described with reference to FIG. 5A-5M and FIG. 9A-9E. With respect to the method for manufacturing the printed wiring board of the embodiment, it is possible that a process other than the processes described above is added, and it is also possible that some of the processes described above are omitted.

The multilayer wiring board of Japanese Patent Laid-Open Publication No. 2009-224739 does not have a core substrate and is formed from only the thin wiring patterns and the insulating layer and the protective film that are mainly formed of resin, and warping is likely to occur during mounting of a semiconductor element or the like. It is likely to be difficult to stably mount a semiconductor element with good connection quality. Further, since the pads connecting a semiconductor element are formed protruding on the insulating layer, an Insulating material is not interposed between the pads. Therefore, unless a solder resist layer or the like is formed, a short-circuit defect between adjacent pads is likely to occur due to wet spreading of a bonding material such as solder. For a wiring board in which connection pads are provided at a fine pitch, it may be difficult to form a solder resist between adjacent connection pads. A short-circuit defect is more likely to occur. It is likely to be difficult to form connection pads at a fine pitch.

A printed wiring board according to an embodiment of the present invention includes a laminate that is formed from alternately conductor layers and resin insulating layers and has conductor layers laminated on both sides of at least one resin insulating layer. The laminate has a first surface and a second surface that is on the opposite side of the first surface, and has multiple first conductor pads that are formed on the first surface, and multiple second conductor pads that are embedded in a resin insulating layer that forms the second surface, one surface of each of the second conductor pads being exposed on the second surface side. The one surface of each of the second conductor pads is recessed from the second surface of the laminate. A solder resist layer having openings that respectively expose the first conductor pads is formed on the first surface of the laminate. A support plate is provided on the first surface of the laminate via the solder resist layer.

A method for manufacturing a printed wiring board according to an embodiment of the present invention includes: forming a conductor layer on a metal foil provided on a base plate; forming a laminate of conductor layers and resin insulating layers by laminating, on the conductor layer, at least one pair of a resin insulating layer and a conductor layer, the laminate having a second surface on the metal foil side and a first surface on the opposite side of the second surface; forming a solder resist layer on the first surface of the laminate; providing a support plate on the first surface of the laminate via the solder resist layer; removing the base plate; and removing the metal foil by etching. The forming of the conductor layer on the metal foil includes forming multiple second conductor pads on the metal foil. The forming of the laminate includes: covering the second conductor pads except for one surfaces thereof on the metal foil side with a resin insulating layer that forms the second surface; and forming first conductor pads in an outermost conductor layer on the first surface side. The removing of the metal foil includes recessing, relative to the second surface of the laminate, the one surfaces of the second conductor pads exposed by removal of the metal foil.

According to an embodiment of the present invention, due to the support plate, warpage or deflection of the printed wiring board is suppressed, and thus, an electronic component can be properly mounted. Further, since a solder resist layer is formed on the support plate side and the conductor pads on the opposite side of the support plate are embedded in a resin insulating layer, occurrence of a short-circuit defect between the conductor pads can be suppressed on both sides of the printed wiring board. Further, conductor pads can be formed at a fine pitch on a surface on the opposite side of the support plate.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a support plate;
   a laminate formed on the support plate and comprising a plurality of first conductor pads on a first surface side of the laminate and a plurality of second conductor pads on a second surface side of the laminate; and
   a solder resist layer interposed between the support plate and the laminate and having a plurality of openings formed such that the openings are exposing the first conductor pads respectively,
   wherein the laminate includes a resin insulating layer and has a first surface on the first surface side and a second surface on the second surface side on an opposite side with respect to the first surface of the laminate, the plurality of second conductor pads is embedded in the second surface of the laminate such that the second conductor pads have surfaces recessed from the second surface of the laminate respectively, and the laminate includes a plurality of third conductor pads formed on the second surface side of the laminate such that the third conductor pads are positioned on an outer peripheral side than the plurality of second conductor pads and have surfaces recessed from the second surface of the laminate respectively.

2. A printed wiring board according to claim 1, wherein the laminate includes a via conductor structure penetrating from the first surface to the second surface of the laminate such that the via conductor structure comprises at least one via conductor formed in the resin insulating layer and tapering from the first surface side toward the second surface side of the laminate.

3. A printed wiring board according to claim 1, wherein the plurality of second conductor pads is formed such that the surfaces of the second conductor pads have a depth in a range of 3 μm or more to less than 10 μm from the second surface of the laminate.

4. A printed wiring board according to claim 1, wherein the plurality of first conductor pads is formed on the first surface of the laminate.

5. A printed wiring board according to claim 1, wherein the second surface of the laminate is not covered with a solder resist layer.

6. A printed wiring board according to claim 1, further comprising:
an electronic component connected to the plurality of second conductor pads such that the electronic component is mounted on the second surface side of the laminate.

7. A printed wiring board according to claim 1, wherein the plurality of second conductor pads is formed such that the plurality of second conductor pads has a pitch that is smaller than a pitch of the plurality of third conductor pads.

8. A printed wiring board according to claim 7, further comprising:
a plurality of conductor posts formed on the second surface side of the laminate such that the conductor posts are formed on the third conductor pads respectively.

9. A printed wiring board according to claim 1, wherein the laminate includes a wiring pattern formed on the second surface side of the laminate such that the wiring pattern is embedded in the second surface of the laminate and connecting at least one of the second conductor pads and at least one of the third conductor pads.

10. A printed wiring board according to claim 1, further comprising:
a plurality of conductor posts formed on the second surface side of the laminate such that the conductor posts are formed on the third conductor pads respectively.

11. A printed wiring board according to claim 10, wherein the plurality of conductor posts is formed such that the plurality of conductor posts has a width that is smaller than a width of the plurality of third conductor pads.

12. A printed wiring board according to claim 11, wherein the third conductor pads have portions protruding from the surfaces recessed from the second surface of the laminate respectively such that the conductor posts and the third conductor pads have interfaces that are substantially coplanar with the second surface of the laminate.

13. A printed wiring board according to claim 10, wherein the conductor posts comprise metal foil layer portions formed in contact with the third conductor pads and plating layer portions formed on the metal foil layer portions respectively.

14. A printed wiring board according to claim 10, wherein the plurality of conductor posts has a height in a range of 50 μm to 200 μm.

15. A printed wiring board according to claim 10, wherein the laminate includes a via conductor structure penetrating from the first surface to the second surface of the laminate such that the via conductor structure, one of the conductor posts and one of the first conductor pads are formed in overlapping positions and that the via conductor structure is connecting the one of the conductor posts and the one of the first conductor pads.

16. A method for manufacturing a printed wiring board, comprising:
forming a conductor layer on a metal foil provided on a base plate;
laminating, on the conductor layer, at least one set of a resin insulating layer and a conductor layer, such that a laminate comprising the conductor layers and resin insulating layer is formed to have a first surface and a second surface on a metal foil side on an opposite side with respect to the first surface;
forming a solder resist layer on the first surface of the laminate;
positioning a support plate on the first surface of the laminate such that the solder resist layer is interposed between the laminate and the support plate;
removing the base plate from the laminate; and
etching the metal foil on the laminate such that the metal foil is removed from the laminate,
wherein the forming of the conductor layer on the metal foil includes forming a plurality of second conductor pads on the metal foil, the forming of the laminate includes forming a plurality of first conductor pads on a first surface side of the laminate, the removing of the metal foil includes exposing surfaces of the second conductor pads and forming the surfaces of the second conductor pads recessed from the second surface of the laminate respectively, the forming of the conductor layer on the metal foil includes forming a plurality of third conductor pads on the metal foil such that the third conductor pads are positioned on an outer peripheral side than the plurality of second conductor pads, and the removing of the metal foil includes exposing surfaces of the third conductor pads and forming the surfaces of the third conductor pads recessed from the second surface of the laminate respectively.

17. A method for manufacturing a printed wiring board according to claim 16, further comprising:
forming a plurality of conductor posts,
wherein the forming of the conductor posts comprises forming the conductor posts on the third conductor pads respectively.

18. A method for manufacturing a printed wiring board according to claim 16, further comprising:
connecting an electronic component to the plurality of second conductor pads such that the electronic component is mounted on the second surface side of the laminate prior to the removing of the base plate.

19. A method for manufacturing a printed wiring board according to claim 17, wherein the forming of the conductor posts comprises forming the plurality of conductor posts such that the plurality of conductor posts has a width that is smaller than a width of the plurality of third conductor pad.

20. A method for manufacturing a printed wiring board according to claim 17, further comprising:

bonding, to the support plate, a second support plate on which a second laminate is formed after the positioning of the support plate on the laminate such that the support plate and the second support plate are bonded to each other on exposed surfaces on opposite sides with respect to the laminate and second laminate; and separating the support plate and the second support plate after the removing of the metal foil, wherein the forming of the conductor posts comprises forming a plurality of conductor posts on a plurality of third conductor pads on the second laminate substantially simultaneously in a same process.

* * * * *